(12) United States Patent
Erbil et al.

(10) Patent No.: US 8,350,444 B2
(45) Date of Patent: Jan. 8, 2013

(54) METHOD AND APPARATUS FOR CONVERSION OF HEAT TO ELECTRICAL ENERGY USING POLARIZABLE MATERIALS AND AN INTERNALLY GENERATED POLING FIELD

(75) Inventors: Ahmet Erbil, Atlanta, GA (US); David F. Walbert, Atlanta, GA (US)

(73) Assignee: The Neothermal Energy Company, Atlanta, GA (US)

(*) Notice: Subject to any disclaimer, the term of this patent is extended or adjusted under 35 U.S.C. 154(b) by 7 days.

(21) Appl. No.: 13/228,051

(22) Filed: Sep. 8, 2011

(65) Prior Publication Data

US 2011/0315181 A1   Dec. 29, 2011

Related U.S. Application Data

(63) Continuation-in-part of application No. 12/465,924, filed on May 14, 2009, now Pat. No. 8,035,274.

(60) Provisional application No. 61/387,760, filed on Sep. 29, 2010.

(51) Int. Cl.
*H02N 11/00* (2006.01)
*H02N 1/00* (2006.01)
*H01L 37/00* (2006.01)

(52) U.S. Cl. ............ 310/306; 136/254; 250/338.2; 322/2 A

(58) Field of Classification Search .......... 310/306–308; 322/2 A; 136/201, 254; 250/338.2
See application file for complete search history.

(56) References Cited

U.S. PATENT DOCUMENTS

| | | |
|---|---|---|
| 3,073,974 A | 1/1963 | Hoh |
| 3,243,687 A | 3/1966 | Hoh |
| 3,554,515 A | 1/1971 | Tonooka et al. |
| 3,824,448 A | 7/1974 | De Rivas |
| 4,074,660 A | 2/1978 | Tsao |
| 4,099,019 A | 7/1978 | Horibe et al. |

(Continued)

FOREIGN PATENT DOCUMENTS

| | | |
|---|---|---|
| EP | 1145333 A | 10/2001 |
| GB | 1506587 A | 4/1978 |
| JP | 55012508 A | 1/1980 |
| JP | 63061125 A | 3/1988 |
| JP | 63233340 A | 9/1988 |

(Continued)

OTHER PUBLICATIONS

Olsen, R., Cascaded Pyroelectric Energy Converter, Ferroelectrics, 1984, vol. 59, pp. 205-219, Gordon and Breach, Science Publishers, Inc. US.

(Continued)

*Primary Examiner* — Burton Mullins
(74) *Attorney, Agent, or Firm* — Morris Manning & Martin, LLP; Tim Tingkang Xia, Esq.

(57) ABSTRACT

A method for converting heat to electricity by exploiting changes in spontaneous polarization that occur in electrically polarizable materials is described. The method uses an internally generated field to achieve poling during cycling. The internal poling field is produced by retaining residual free charges on the electrodes at the appropriate point of each cycle. The method obviates the need for applying a DC voltage during cycling and permits the use of the electrical energy that occurs during poling rather than an external poling voltage which detracts from the net energy produced per cycle. The method is not limited to a specific thermodynamic cycle and can be used with any thermodynamic cycle for converting heat to electricity by thermally cycling electrically polarizable materials. The electrical energy generated can be used in various applications or stored for later use. An apparatus for converting heat to electricity is also described.

54 Claims, 23 Drawing Sheets

U.S. PATENT DOCUMENTS

| | | | |
|---|---|---|---|
| 4,210,820 A | 7/1980 | Wittig | |
| 4,220,906 A | 9/1980 | Drummond | |
| 4,226,606 A | 10/1980 | Yaeger et al. | |
| 4,245,693 A | 1/1981 | Cheng | |
| 4,296,800 A | 10/1981 | Johnson | |
| 4,327,670 A | 5/1982 | Teller | |
| 4,372,937 A | 2/1983 | Johnson | |
| 4,425,540 A * | 1/1984 | Olsen | 322/2 A |
| 4,589,890 A | 5/1986 | Gronvaldt | |
| 4,647,836 A | 3/1987 | Olsen | |
| 4,651,814 A | 3/1987 | Ito et al. | |
| 4,766,952 A | 8/1988 | Onodera | |
| 4,983,839 A | 1/1991 | Deb | |
| 5,555,838 A | 9/1996 | Bergman | |
| 5,625,245 A | 4/1997 | Bass | |
| 5,851,498 A | 12/1998 | Rozenshtein et al. | |
| 6,379,809 B1 | 4/2002 | Simpson et al. | |
| 6,431,856 B1 | 8/2002 | Maenishi et al. | |
| 6,528,898 B1 | 3/2003 | Ikura et al. | |
| 6,742,337 B1 | 6/2004 | Hays et al. | |
| 7,043,912 B1 | 5/2006 | Radcliff et al. | |
| 7,323,506 B2 | 1/2008 | Kouchachvili et al. | |
| 7,328,578 B1 | 2/2008 | Saucedo | |
| 7,569,194 B2 | 8/2009 | Russell | |
| 7,593,250 B2 | 9/2009 | Naumov et al. | |
| 7,735,321 B2 | 6/2010 | Howard | |
| 7,768,050 B2 | 8/2010 | Rappe et al. | |
| 7,807,917 B2 * | 10/2010 | Atanackovic | 136/236.1 |
| 2003/0162394 A1 | 8/2003 | Takemura | |
| 2006/0122299 A1 | 6/2006 | Kouchachvili et al. | |
| 2008/0074211 A1 | 3/2008 | Miles et al. | |
| 2008/0130346 A1 | 6/2008 | Naumov et al. | |
| 2008/0295879 A1 | 12/2008 | Atanackovic | |
| 2009/0010303 A1 | 1/2009 | Nagashima et al. | |
| 2010/0037624 A1 * | 2/2010 | Epstein et al. | 62/3.1 |
| 2010/0289377 A1 | 11/2010 | Erbil et al. | |
| 2011/0001390 A1 | 1/2011 | Erbil et al. | |
| 2011/0298333 A1 * | 12/2011 | Pilon | 310/306 |

FOREIGN PATENT DOCUMENTS

| | | |
|---|---|---|
| KR | 1020070056373 A | 6/2007 |
| WO | 9313564 A1 | 7/1993 |
| WO | 9965051 A2 | 12/1999 |
| WO | 00/36656 A1 | 6/2000 |
| WO | 0036656 A1 | 6/2000 |
| WO | 2005011376 A2 | 2/2005 |
| WO | 2006058417 A1 | 6/2006 |
| WO | 2007140061 A2 | 12/2007 |
| WO | 2008088994 A2 | 7/2008 |
| WO | 2010061385 A1 | 6/2010 |

OTHER PUBLICATIONS

Vanderpool, D., Simulations of a Prototypical Device Using Pyroelectric Materials for Harvesting Waste Heat, Intl. J. of Heat & Mass Transfer, vol. 51, 2008, pp. 5052-5062, Los Angeles.

Lines, M. E. et al., "Principles and Applications of Ferroelectrics and Related Materials", App. F, 1977, Oxford University Press Inc., New York.

Olsen and Evans, "Pyroelectric Energy Conversion: Hysteresis loss and temperature sensitivity of a ferroelectric aterial", J. Appl. Phys. 54, Oct. 1983.

Kouchachvili and Ikura, "Pyroelectric Conversion—Effects of P(VDF-TrFE) preconditioning on Power Conversion", Journal of Electrostatics 65, 2007, pp. 182-188.

Tiffany, W., Coherent Inc.: The Amazing Versatile Pyroelectric, pp. 1-3.

U.S. DOE, A Technology Roadmap for Generation IV Nuclear Systems, 2002.

Study prepared for the U.S. Department of Energy by an MIT-lead interdisciplinary panel, The Future of Geothermal Energy: Impact of Enhanced Geothermal Systems (EGS) of the United States in the 21st Century, 2006.

V. Viswanathan, Opportunity Analysis for Recovering Energy From Industrial Waste Heat and Emissions, Pacific NW Nat'l Lab., 2005.

Prepared for the U.S. DOE, Energy Use, Loss and Opportunities Analysis: U.S. Manufacturing and Mining, 2004.

A. Burke, Energy Storage in Advanced Vehicle Systems, Institute of Transportation Studies, Univ. of California, Davis, (presented at Stanford University, 2005).

J. Yang, Thermolectric Technology for Automotive Waste Heat Recovery, General Motors R&D, presented at the 2007 DEER Conference, sponsored by U.S. DOE.

Duffie et al., Solar Engineering of Thermal Processes, John Wiley & Sons, Inc., 3rd Ed., 2006.

Babcock et al., Steam: Its Generation and Use, Chs. 47-56, 40th Ed. 1992.

Frank Incropera et al., Fundamentals of heat and Mass Transfer, John Wiley & Sons, Inc., 6th Ed., 2006.

Michael Moran et al., Introduction of Thermal Systems Engineering: Thermodynamics, Fluid Mechanics, and Heat Transfer, John Wiley & Sons, Inc., 2003.

Deborah Kaminiski et al., Introduction of Thermal and Fluids Engineering, John Wiley & Sons, Inc., 2005.

M. Wakil, Nuclear Energy Conversion, American Nuclear Society, 1992.

Robert Serth, Process Heat Transfer: Principles and Applications, Elsevier, 2007.

Hayes et al., Introduction to Catalytic Combustion, Gordon and Breach Science Publishers, 1997.

G.P. Peterson, An Introduction to Heat Pipes: Modeling, Testing and Applications, 1994.

* cited by examiner

900

910 — Providing a ferroelectric layer formed of a ferroelectric material characterized with a Curie temperature, $T_C$, with a pair of electrodes on the first and second surface of the ferroelectric layer, respectively.

920 — Alternatively delivering a flow of cold and hot fluids so as to alternately cool the ferroelectric layer to a first temperature $T_L$ that is lower than the Curie temperature $T_C$, and heat the ferroelectric layer to a second temperature $T_H$; the ferroelectric material of the ferroelectric layer thereby undergoes alternating phase transitions between the ferroelectric phase and the paraelectric phase with temperature cycling. The electrical circuit is open during heating and cooling under constant polarizations, $P_H$ and $P_L$, respectively.

930 — Alternatively delivering a flow of cold and hot fluids to as to alternatively remove heat from the ferroelectric layer isothermally at $T_L$ and add heat to the ferroelectric layer isothermally at $T_H$. During these steps, the electrical circuit is closed so that the addition and withdrawal of heat occurs while polarization alternates between maximum and minimum levels, $P_H$ and $P_L$, respectively.

940 — Poling the ferroelectric material as heat is removed isothermally at $T_L$ while polarization increases from $P_L$ to $P_H$, thereby generating electrically-opposite screening charges on the pair of electrodes.

950 — Outputting electric energy corresponding to the generated electrically-opposite screening charges on the pair of electrodes when heat is added isothermally to the ferroelectric material at $T_H$ and polarization is reduced from $P_H$ to $P_L$.

FIG. 7

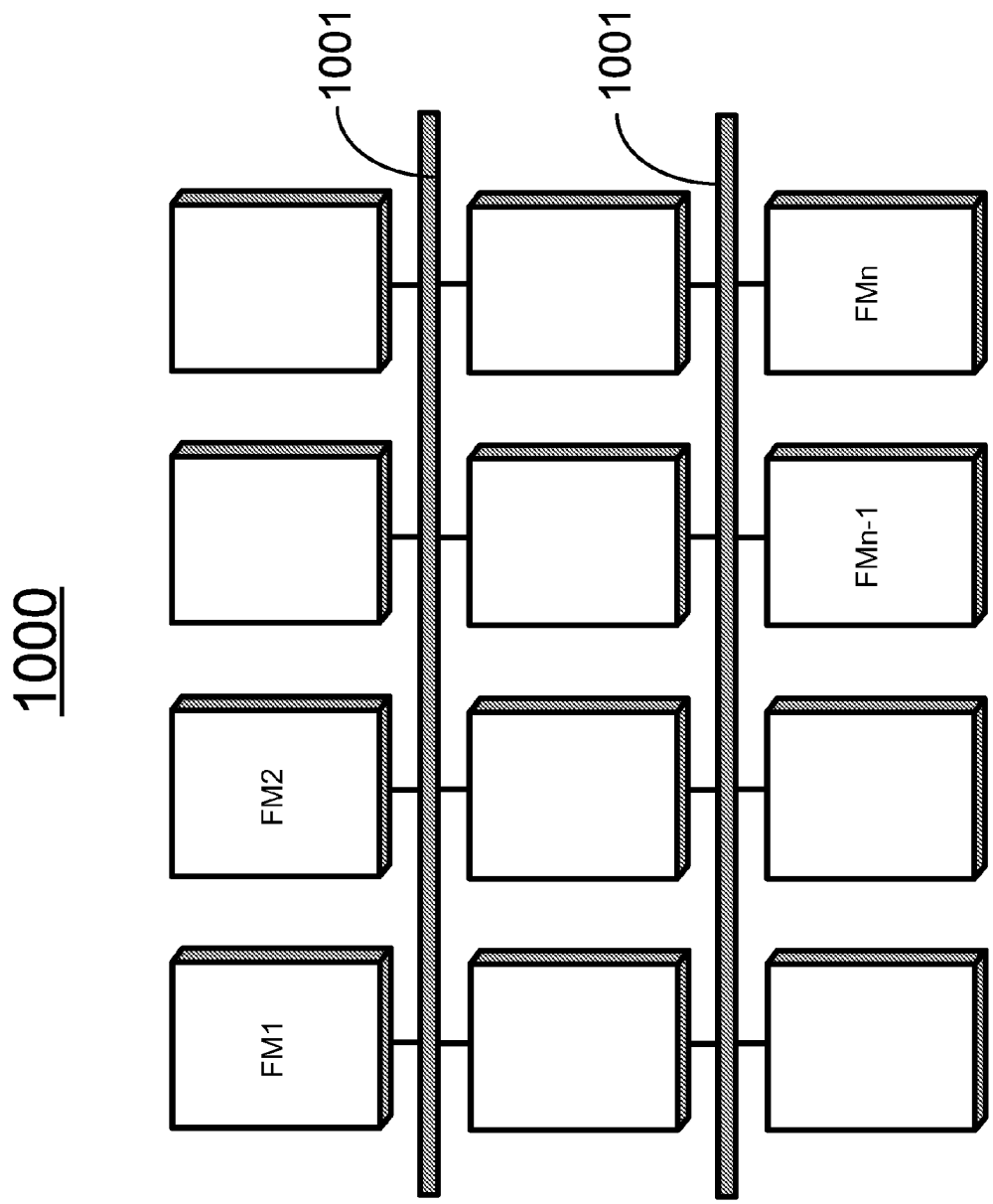

US 8,350,444 B2

METHOD AND APPARATUS FOR CONVERSION OF HEAT TO ELECTRICAL ENERGY USING POLARIZABLE MATERIALS AND AN INTERNALLY GENERATED POLING FIELD

CROSS-REFERENCE TO RELATED PATENT APPLICATIONS

This application is a continuation-in-part of U.S. patent application Ser. No. 12/465,924, filed May 14, 2009, now allowed. This application also claims the benefit of Provisional U.S. Patent Application Ser. No. 61/387,760, filed Sep. 29, 2010, pending. Each of the above applications is incorporated by reference herein in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention generally relates to conversion of heat to electrical energy, and more particularly to methods that utilize spontaneous polarization of ferroelectric materials that occurs when they are in a temperature range corresponding to their ferroelectric phase, and diminishes or disappears rapidly as the ferroelectric materials approach, or transition into, their paraelectric or antiferroelectric phase as the temperature changes, so as to convert heat to electric energy.

BACKGROUND OF THE INVENTION

The use of capacitors with temperature dependent dielectric constants to convert heat to electric energy is well known. Representative devices that use dielectrics as variable capacitors to generate electricity are disclosed, for example, in U.S. Pat. No. 4,220,906 to Drummond, U.S. Pat. Nos. 4,425,540 and 4,647,836 to Olsen, U.S. Pat. No. 6,528,898 to Ikura et al. and U.S. Pat. No. 7,323,506 to Kouchachvili et al. Those devices simply utilize the fact that the dielectric constant of certain materials, such as ferroelectrics, varies as temperature varies. Specifically, those devices use the dielectrics as temperature dependent variable capacitors, the capacitance of which decreases as the temperature is increased by the absorption of heat. The capacitor is partially charged under an applied field at the lower temperature, and is then fully charged by increasing the electric field. The capacitor is then heated while under that large field, and it partially discharges as the dielectric constant decreases with increasing temperature and correspondingly decreasing capacitance. Further discharge occurs by reducing the applied field while the capacitor remains at high temperature. (U.S. Pat. No. 4,425,540 to Olsen). Such cycling of the temperature and dielectric constant of a capacitor under an applied field is referred to as the Olsen cycle.

The physics of the capacitor device is straightforward. The voltage V of a capacitor of capacitance C is inversely proportional to the dielectric constant $\in$:

$$V = Q/C = Q/[\in(T)\in_0(A/d)].$$

After the capacitor has been fully charged by application of the external field under the Olsen cycle, the capacitor is heated to a temperature at which the dielectric constant, $\in$, decreases. During that heating step of the Olsen cycle, partial discharge occurs because the charge, Q, held by the capacitor decreases while V is held constant.

The use of dielectrics as variable capacitors to generate electricity is also reported by Olsen in Cascaded Pyroelectric Converter, 59 FERROELECTRICS 205 (1984). Olsen reports a maximum power density of 33 W/L (about 4 W/kg) using the ferroelectric PZST as the dielectric material in a variable capacitor device with multiple stages and regeneration. Using finite element simulation, Vanderpool calculates that the Olsen cycle yields a power density of 24 W/L (about 3 W/kg) under certain conditions using PZST as the dielectric material in a variable capacitor. Vanderpool, Simulations of a Prototypical Device Using Pyroelectric Materials for Harvesting Waste Heat, 51 INT. J. HT & MASS TRANSFER 5051 (2008).

The variable capacitor method of converting heat to electricity is not the most effective method of using ferroelectrics to generate electricity, however. True pyroelectric generation focuses, instead, on the inherent polarization that occurs spontaneously in the ferroelectric phase, independent of polarization induced by an applied field. That inherent polarization provides a much more robust source of electric energy. Variable capacitors do not use the powerful inherent spontaneous polarization that occurs in ferroelectrics without an applied field. Further, the application of large external fields and the continuous application of an external field during cycling impede the more powerful energy conversion that can be achieved with ferroelectrics through spontaneous polarization. Such external fields prevent the effective use of the tremendous electrical energy that arises from the electric dipoles of ferroelectric materials spontaneously and without induction by an external field.

Apparatus and methods for using the inherent spontaneous polarization of ferroelectrics to convert heat-to-electricity are disclosed in U.S. patent application Ser. No. 12/465,924 and U.S. Pat. No. 7,982,360 to Erbil. The inventions presented there, unlike the prior art, utilize the spontaneous polarization of ferroelectrics, together with the rapid change in spontaneous polarization that occurs during phase transition, to convert heat-to-electrical energy. Unlike the variable capacitor approach, those inventions do not rely on the application of an electric field to induce electric dipoles in the ferroelectric material. They do contemplate the use of a small electric field during or after transition to the ferroelectric phase in order to pole the ferroelectric, but that field is not used to create the fundamental polarization in the unit cells themselves. The poling field simply aligns the inherent electric dipoles that occur spontaneously when the material is at a temperature that causes it to be in its ferroelectric phase.

The apparatus and methods set forth in application Ser. No. 12/465,924 and U.S. Pat. No. 7,982,360 are a new way of converting thermal energy to electricity. With that new methodology, there exists a need to address optimal ways to use spontaneous polarization for the purpose of generating electricity from thermal energy.

SUMMARY OF THE INVENTION

The present invention provides an apparatus and enhanced method for converting heat to electric energy by the use of ferroelectrics in which the phase transitions into and out of the ferroelectric phase occur at desired temperatures. This invention discloses a new way to provide the essential poling of the ferroelectric without using an external voltage during each cycle. Instead, a residual field remains during each cycle, and that field poles the ferroelectric as it transitions into its ferroelectric phase. The invention can also be used with other electrically polarizable materials. This invention discloses a new thermodynamic cycle that allows for greater output of electrical energy than may be possible with other cycles.

When in the ferroelectric phase, very strongly polarized electric dipoles develop spontaneously in the unit cells of one or more ferroelectrics, which occurs without the application of an external field. By poling to align the unit cells and domains, the polarization of the individual unit cells and domains combines to produce an extremely large net spontaneous polarization in the overall material system. That net polarization is designated as $P_s$. The present invention utilizes the spontaneous polarization, together with the rapid change in that polarization that occurs during thermal cycling, to convert heat to electrical energy. The present invention does not require temperature variability of the dielectric constant. The electrical energy that is generated as a result of spontaneous polarization, and released with the diminution or disappearance of polarization, can be much greater than the electrical energy generated using a ferroelectric through the application of an external electric field in the variable capacitor mode.

By utilization of one or more heat exchangers, the temperature of the ferroelectric material is controlled so that it undergoes transition into the ferroelectric phase. During that transition, a relatively small electric field poles the ferroelectric. That poling field aligns the spontaneous electric dipoles to the extent allowed by the molecular and crystal structure of the particular material. Poling is essential to using the spontaneous dipoles in the ferroelectric as an effective means to convert heat to electricity. Although application of large electric fields are essential for operation of variable capacitor devices and the Olsen cycle, the application of such external fields, and fields beyond the minimum required for poling, generally impede the use of spontaneous polarization as a way of generating electrical energy.

The present invention discloses a novel way of poling the spontaneous electric dipoles during transition into the ferroelectric phase. In U.S. patent application Ser. No. 12/465,924 and U.S. Pat. No. 7,982,360, the poling field is created from an external voltage source. With the present invention, the poling field is instead generated from residual free charges on the electrodes on the surfaces of the ferroelectric material. In this invention, the thermal and electrical cycle is controlled so that a relatively small residual charge is left on the electrodes, rather than being more completely removed as in previous disclosures. That residual charge creates the poling field that causes the electric dipoles that are established spontaneously during transition to the ferroelectric phase to be poled.

When the ferroelectric material of the present invention is in its ferroelectric phase and poled, a very strong inherent electric field results spontaneously from the dipoles, without induction by application of an external field. The spontaneous polarization gives rise to very dense bound charges on the surfaces of the ferroelectric, which in turn induce opposing, screened charges on electrodes that are on the surfaces of the ferroelectric material. At that point, the net electric field in the electrodes is negligible. By utilization of one or more heat exchangers, the temperature of the ferroelectric is then changed so that it becomes either paraelectric or antiferroelectric, depending upon the particular material used and the phase transition temperature around which the material is cycled. By causing the ferroelectric to go through phase change and rendering the bound surface charges negligible, the screened charges on the electrodes become unscreened and can be removed to external circuitry for general purposes.

As disclosed in U.S. patent application Ser. No. 12/465,924 and U.S. Pat. No. 7,982,360 to Erbil, by utilization of one or more heat exchangers the temperature of a ferroelectric material can be cycled around the phase transition temperature, or Curie temperature, $T_c$, so that thermal energy can be effectively converted to electrical energy with the invention operating between a heat source and heat sink. Electric energy is generated by cycling the ferroelectric module above and below the phase transition temperature in accordance with the apparatus and method described in that application. Various thermodynamic cycles can be used to exploit spontaneous polarization in ferroelectrics for the purpose of converting heat to electricity. The general cycle set forth in U.S. patent application Ser. No. 12/465,924 and U.S. Pat. No. 7,982,360 can be used with the present invention in order to generally eliminate the need for applying an external voltage to pole the ferroelectric during each cycle.

A specific thermodynamic cycle that has four steps, two of which are isothermal and two of which occur at constant polarization, is disclosed in U.S. patent application Ser. No. 13/226,799. The present invention can be used in conjunction with that or other thermodynamic cycles, thereby eliminating the need for application of external poling voltage. Using that cycle or another cycle with the present invention, total polarization is not allowed to drop below a value $P_L$ at any point of the cycle. $P_L$ is the minimum level at which the resulting field is sufficient to cause poling when the ferroelectric is transitioned into its ferroelectric phase.

Using the cycle disclosed in U.S. patent application Ser. No. 13/226,799, the ferroelectric is cooled during a first step of that cycle to a relatively low temperature, $T_L$, below the transition temperature, while total polarization is held constant at the relatively low value, $P_L$, and the electrical circuit is open. During the next step, heat is withdrawn isothermally until polarization is increased to the maximum value for the cycle, $P_H$, at which point a very dense bound charge is present on the surface of the electrode. During that step, the electrical circuit is closed so that a current flows from the electrode on one side of the ferroelectric to the electrode on the opposite side of the ferroelectric. Screening charges that develop on the electrodes equal the opposing bound charges at the surfaces of the ferroelectric. It is during that step that the residual poling field causes the resulting dipoles to be biased in one orientation—i.e., they become poled.

In the next step of the cycle, the circuit is opened while the ferroelectric or other polarizable material is heated to a relatively high temperature, TH, above the transition temperature. Total polarization remains constant during that step, and the material goes into a metastable state. During the final step of the cycle, the circuit is again closed and heat is input isothermally until polarization is reduced to PL. During that step, the screened charges on the electrode become unscreened and are discharged into external circuitry at a self-generated high voltage. However, all of the charges on the electrode are not removed. Instead, the circuit is opened at a point where a great enough residual charge remains to establish a field sufficient for poling, which corresponds to PL. Poling from such a residual field rather than by applying an external voltage can enhance the overall output of electrical energy during the course of a cycle.

The cycle is then repeated continuously, with the result that thermal energy is continuously converted to electrical energy at high voltage. The invention can be used with ferroelectrics that are in either solid or liquid form, the latter including liquid ferroelectrics and ferroelectric fine crystals suspended in liquid. For example, the solid materials that can be used include ceramic ferroelectrics, ferroelectric polymers, and other polarizable polymers. In addition to the ordinary ferroelectrics, extrinsic (or improper) ferroelectrics, such as boracites and sodalites, can be used with this invention. With extrinsic ferroelectrics, polarization represents a second order parameter, which is coupled to some primary order parameter. Exploiting the spontaneous polarization of ferroelectrics with the present invention allows a robust conversion of heat to electrical energy over a wide range of temperatures using heat supplied from a many sources, both naturally occurring and generated. Heat can be input to the ferroelectric from the heat source or withdrawn from the ferroelectric to the heat sink by conduction, convection or radiation or by any combination thereof, and by one or two-phase heat transfer systems.

A single stage power conversion module includes a single ferroelectric or other polarizable material. As such, it generally has a single phase transition temperature reflecting the transition between the ferroelectric phase and the paraelectric or the antiferroelectric phase. In order to more effectively convert available thermal energy to electricity in applications where the temperature difference, $\Delta T$, between the heat source and heat sink is sufficient, a series of ferroelectric or other polarizable materials may be used that have a succession of phase transition temperatures that incrementally cover all, or at least some, of the range of temperatures between the heat source and heat sink. The magnitude of $\Delta T$ that warrants a multi-stage device depends on the parameters and requirements of the application and the characteristics of the particular material used. The use of heat regeneration techniques may also affect the number of stages desired in a particular application.

In one aspect, the present invention relates to an apparatus for converting heat to electric energy. In one embodiment, the apparatus has a ferroelectric layer having a first surface and an opposite, second surface, where the ferroelectric layer is comprised of a ferroelectric material with a phase transition temperature such that, when the material is in a ferroelectric phase spontaneous polarization is established in the unit cells of the ferroelectric, and the ferroelectric layer, when poled, develops an overall net spontaneous polarization; and such that, as the temperature of the ferroelectric changes so that it traverses the transition temperature, the material enters a paraelectric or antiferroelectric phase wherein the ferroelectric layer has negligible or no overall net spontaneous polarization.

The apparatus also has a pair of electrodes respectively positioned on the first surface and the second surface of the ferroelectric layer, wherein the electrodes consist of a thermally and electrically conductive material, and means positioned in relation to the pair of electrodes for alternately inputting and removing heat through convection, conduction, or radiation to and from the ferroelectric layer so as to, respectively, heat the ferroelectric layer at a temperature $T_H$ that is higher than the phase transition temperature, and alternately cool the ferroelectric layer at a temperature $T_L$ that is lower than the phase transition temperature, so that the ferroelectric material of the ferroelectric layer thereby undergoes alternating phase transitions between (1) the ferroelectric phase and (2) the paraelectric or antiferroelectric phase.

In another aspect, the present invention relates to an apparatus for converting heat to electric energy. In one embodiment, the apparatus includes a ferroelectric layer having a first surface and an opposite, second surface. The ferroelectric layer consists of a ferroelectric material characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature $T_c$, spontaneous polarization is not established in the unit cells of the ferroelectric material. The apparatus also includes a pair of electrodes positioned respectively on the first surface and the second surface of the ferroelectric layer. The pair of electrodes is comprised of a thermally and electrically conductive material.

Furthermore, the apparatus includes means positioned in relation to the pair of electrodes for alternately delivering a cold fluid and a hot fluid over the first surface and the second surface of the ferroelectric layer so as to alternately (1) cool the ferroelectric layer at a first temperature $T_L$ that is lower than the Curie temperature $T_c$, and (2) heat the ferroelectric layer at a second temperature $T_H$ that is higher than the Curie temperature $T_c$, so that the ferroelectric material of the ferroelectric layer thereby undergoes alternating phase transitions between the ferroelectric phase and the paraelectric phase with temperature cycling.

Additionally, the apparatus may have a pair of electric leads electrically connected to the pair of electrodes such that when the ferroelectric material is cycled to diminish the total polarization of the ferroelectric layer, the electric energy corresponding to the electrically-opposite screening charges is output to the pair of electric leads at high voltage. The electric leads may also be connected through a switch to permit application of a DC voltage between the pair of electric leads so as to create a poling field to be applied when the ferroelectric material is in, or transitioning into, its ferroelectric phase. The application of such an external voltage would not normally be required after the first cycle because the use of the residual field that as disclosed in the present invention will accomplish poling in the subsequent cycles, but the presence of a DC voltage source may be desirable for imposition of an external poling field in the event that the residual field for any reason became insufficient to pole, so that a supplemental field may be useful but not essential.

Moreover, the apparatus may include means for monitoring one or more of the temperature and capacitance of the ferroelectric layer and the temperature and pressure of the heating and cooling fluids.

In another embodiment, the delivering means comprises a first fluid passage and a second fluid passage formed on the pair of electrodes, respectively, such that when a cold fluid passes through at least one of the first and second fluid passages, the ferroelectric layer is cooled, and when a hot fluid passes through at least one of the first and second fluid passages, the ferroelectric layer is heated; one or more heat exchangers positioned such that the first and second fluid passages alternately deliver a cold fluid and a hot fluid over the first surface and the second surface of the ferroelectric layer so as to alternately cool the ferroelectric layer at a first temperature $T_L$, and heat the ferroelectric layer at a second temperature $T_H$; and a plurality of control valves in communication with the one or more heat exchangers for controlling the flow of cold and hot fluids. The plurality of control valves is controlled by microcontrollers, and they are coordinated by computer control through a control circuit to achieve the desired cycle.

In yet another aspect, the present invention relates to a method for converting heat to electric energy. In one embodiment, the method includes the steps of providing a ferroelectric layer having a first surface and an opposite, second surface, wherein the ferroelectric layer is comprised of a ferroelectric material with a phase transition temperature such that, when the material is in a ferroelectric phase spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization; and including a pair of electrodes positioned respectively on the first surface and the second surface of the ferroelectric layer, the electrodes being comprised of a thermally and electrically conductive material.

The method also includes the steps of alternately delivering a cold fluid and a hot fluid so as to alternately cool the ferroelectric layer to a temperature that is lower than the Curie temperature, $T_c$, and heat the ferroelectric layer to a second temperature that is higher than the Curie temperature $T_c$. During these steps, the electrical circuit is opened and cooling and heating occur under constant polarization.

The method also includes the steps of alternately providing and removing heat to and from the ferroelectric layer, isothermally, by alternately delivering a flow of hot fluid and a flow of cold fluid as to alternately add or remove heat to the ferroelectric layer while total polarization changes to corresponding low and high levels denoted as $P_L$ and $P_H$ respectively. During these steps, the electrical circuit is closed to allow changing polarization, and the heat removed or added corresponds to the enthalpy of transition.

The method also includes poling the ferroelectric material of the ferroelectric layer when it is in the ferroelectric phase at temperature $T_L$. In one embodiment, the poling is performed by a field that results from residual free charges left on the electrodes after the first cycle. The method also includes the step of discharging the electrical energy generated in the ferroelectric material of the ferroelectric layer into external circuitry by closing the circuit while heat is input into the ferroelectric layer, isothermally, and polarization diminishes to a minimum level, $P_L$, that is sufficient to provide for poling during transition to the ferroelectric phase.

In one embodiment, the thermal delivering step is performed by one or more heat exchangers that are in fluid communication with a heat source and a heat sink for inputting heat from the heat source to the ferroelectric layer so as to heat it, and withdrawing heat from the ferroelectric layer to the heat sink so as to cool it. In another embodiment, the thermal delivering step is performed by one or more heat exchangers and a plurality of control valves in communication with the one or more heat exchangers, wherein are positioned first and second fluid passages for alternately delivering a cold fluid and a hot fluid over the first surface and the second surface of the ferroelectric layer so as to alternately cool and heat the ferroelectric layer, and wherein the plurality of control valves is adapted for controlling the flow of cold and hot fluids. In each instance, the electrical circuit is switched between open and closed positions in coordination with the heating and cooling cycling described herein.

In addition to materials with a crystal structure, amorphous polymer materials that are electrically polarizable can be used with the invention. For such amorphous polymers, the polarizable units exhibit electric dipolar behavior at the atomic and molecular level. An overall net polarization occurs with such polarizable amorphous polymer (and copolymer) systems, when poled, and that net polarization diminishes and disappears when the temperature of the material traverses the depolarization transition temperature. The changes in polarization that occur with cycling of such amorphous polymer systems around their depolarization transition temperatures are exploited by the invention in the same general fashion as the invention uses the spontaneous polarization, and changes in polarization, that occur in crystalline ferroelectric materials. For amorphous materials, the depolarization transition temperature is analogous to $T_c$ or to the ferroelectric phase transition. Where reference is made to the use of ferroelectric materials and ferroelectric layers in the invention, it should be understood that polarizable amorphous polymers (and copolymers) with appropriate polarization and transition characteristics can also be used with the invention.

In a further aspect, the present invention relates to an apparatus for converting heat to electric energy. In one embodiment, the apparatus has a plurality of ferroelectric modules, $\{FM^n\}$, arranged in a stack, where n=1, 2, 3, ... N, N being an integer greater than one. Each ferroelectric module $FM^n$ includes a ferroelectric layer having a first surface and an opposite, second surface, wherein the ferroelectric layer is formed of a ferroelectric material characterized with a transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization. In one embodiment, a pair of electrodes consisting of a thermally and electrically conductive material is positioned on the first surface and the second surface of the ferroelectric stack. In another embodiment, such electrodes are also positioned on the first surface and the second surface of each ferroelectric module, $FM^n$; and in yet another embodiment, such electrodes between adjacent ferroelectric modules are separated by an electrical insulator. The transition temperatures $\{T^n\}$ of the plurality of ferroelectric modules $\{FM^n\}$ may vary successively across the range between temperatures of a heat source and a heat sink.

The apparatus further includes means positioned in relation to the stacked ferroelectric modules $\{FM^n\}$ for alternately inputting and removing heat through convection, conduction, or radiation to and from the stacked ferroelectric modules $\{FM^n\}$ so as to alternately cool the stacked ferroelectric modules $\{FM^n\}$ at a first temperature that is lower than each transition temperature $T^n$, and heat the stacked ferroelectric modules $\{FM^n\}$ at a second temperature that is higher than each transition temperature $T^n$, such that each ferroelectric layer of the stacked ferroelectric modules $\{FM^n\}$ thereby undergoes alternating phase transitions between (1) the ferroelectric phase and (2) the paraelectric or antiferroelectric phase.

The apparatus may further include devices to monitor the temperature and capacitance of one or more ferroelectric modules $FM^n$ and the temperature and pressure of the heating and cooling fluids. Thermal cycling is coordinated with the electrical status of the ferroelectric modules $\{FM^n\}$ through a control circuit to synchronize heating and cooling with electrical input and output, which in one embodiment is a cycle that utilizes two isothermal steps and two steps with equal polarization, together with poling and electrical discharge.17

In yet a further aspect, the present invention relates to an apparatus for converting heat to electric energy. In one embodiment, the apparatus has a plurality of ferroelectric modules, $\{FM^n\}$, arranged in a stack, where n=1, 2, 3, ... N, N being an integer greater than one. Each ferroelectric module $FM^n$ includes a ferroelectric layer having a first surface and an opposite, second surface, wherein the ferroelectric layer is formed of a ferroelectric material characterized with a Curie temperature, $T_c''$, such that when the temperature of the ferroelectric material is lower than the Curie temperature, $T_c''$, the ferroelectric material is in a ferroelectric phase in which spontaneous polarization is established in the unit cells of the ferroelectric material, and when the temperature of the ferroelectric material is greater than the Curie temperature, $T_c''$, spontaneous polarization is not established in the unit cells of the ferroelectric material; and in one embodiment a first electrode and a second electrode are positioned on the first surface and the second surface of the ferroelectric stack, respectively; and in another embodiment a first electrode and a second electrode are positioned on the first surface and the second surface of each ferroelectric module, FM''. Different ferroelectric layers of the plurality of ferroelectric modules $\{FM''\}$ are comprised of an identical ferroelectric material or different ferroelectric materials. In one embodiment where a first electrode and a second electrode are positioned on the first surface and the second surface of each ferroelectric module, FM'', each two adjacent ferroelectric modules are separated by an electrical insulator. The Curie temperatures $\{T_c''\}$ of the plurality of ferroelectric modules $\{FM''\}$ may vary successively across the range between temperatures of a heat source and a heat sink.

The apparatus further includes means positioned in relation to the stacked ferroelectric modules $\{FM''\}$ for alternately delivering a cold fluid and a hot fluid over the stacked ferroelectric modules $\{FM''\}$ so as to alternately cool the stacked ferroelectric modules $\{FM''\}$ at a first temperature that is lower than each Curie temperature $T_c''$, and heat the stacked ferroelectric modules $\{FM''\}$ at a second temperature that is higher than each Curie temperature $T_c''$, thereby each ferroelectric layer of the stacked ferroelectric modules $\{FM''\}$ undergoes alternating phase transitions between the ferroelectric phase and the paraelectric phase with temperature cycling.

The apparatus may further include devices to monitor the temperature and capacitance of one or more ferroelectric modules FM'' and the temperature of the heating and cooling fluids. Thermal cycling is coordinated with the electrical status of the ferroelectric modules $\{FM''\}$ under computer control so as to synchronize heating and cooling with electrical input and output, pursuant to the general cycle of the invention that utilizes two isothermal steps and two steps with equal polarization, together with poling and electrical discharge.

The invention can be used for an extremely broad range of applications, including both for improvements to exiting devices and for new devices. By way of illustrative example and not with any intention to limit the application of the invention, others being apparent to those skilled in the art, such applications include: (1) bottoming up thermal power plants by converting waste heat to additional power output; (2) use of the present invention as the principal or sole means of converting thermal energy to electricity at power plants; (3) generation of electric power from geothermal energy sources, including passive geothermal heating and cooling systems; (4) generation of electric power from heat provided by solar energy, such generation being on any scale from, for example, a few watts or less to over 1,000 MW; (5) generation of distributed power with portable or quasi-portable generators using a variety of heat sources and operating on a scale from, for example, a few watts or less to 100kW or more; (6) conversion to power of waste heat from industrial, mining, and other such sources; (7) power electric motor vehicles by generating electricity from thermal energy produced on board the vehicle, or otherwise, by combusting gas or other means; (8) producing electric power for diesel electric locomotives either from their waste heat or as the principal means of generating electricity; (9) generation of power from ocean thermal gradients; (10) cooling and refrigeration in a multitude of specific applications, whereby electric energy is used to extract heat from the desired source, in reverse operation of the cycling used to generate electricity from heat; (11) generation of electricity for personal or medical use from body heat; (12) small power sources for personal electronic devices, PCs, GPS systems, and the like; (13) generation of power from heat from biomass or municipal waste; and (14) power generation in space from, for example, heat generated by radioisotopes.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more aspects or embodiments of the invention and, together with a written description, serve to explain the principles of the invention. Where practical, the same reference numbers are used throughout the drawings to refer to the same or like elements of an embodiment.

FIG. 7 is a flow chart of a process for converting heat to electric energy according to one embodiment of the present invention.

FIG. 8 shows schematically a ferroelectric device for converting heat to electric energy according to one embodiment of the present invention.

DETAILED DESCRIPTION OF THE INVENTION

Figure 1:
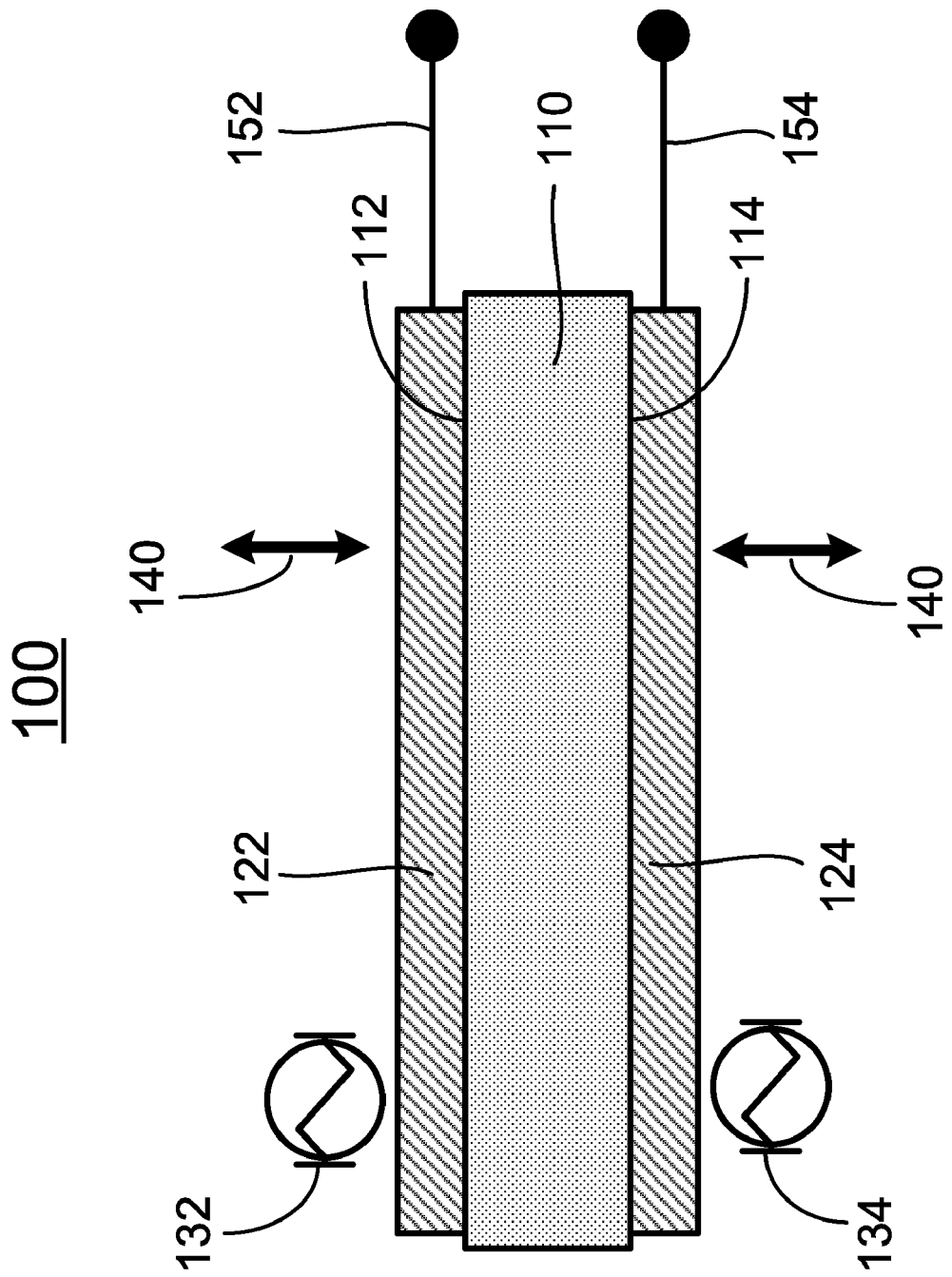
FIG. 1 is schematically a cross-sectional view of a ferroelectric device for converting heat to electric energy that utilizes changes in spontaneous polarization that occurs in temperature cycling to generate electric charges that can be removed to external circuitry at high voltage, according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 14:
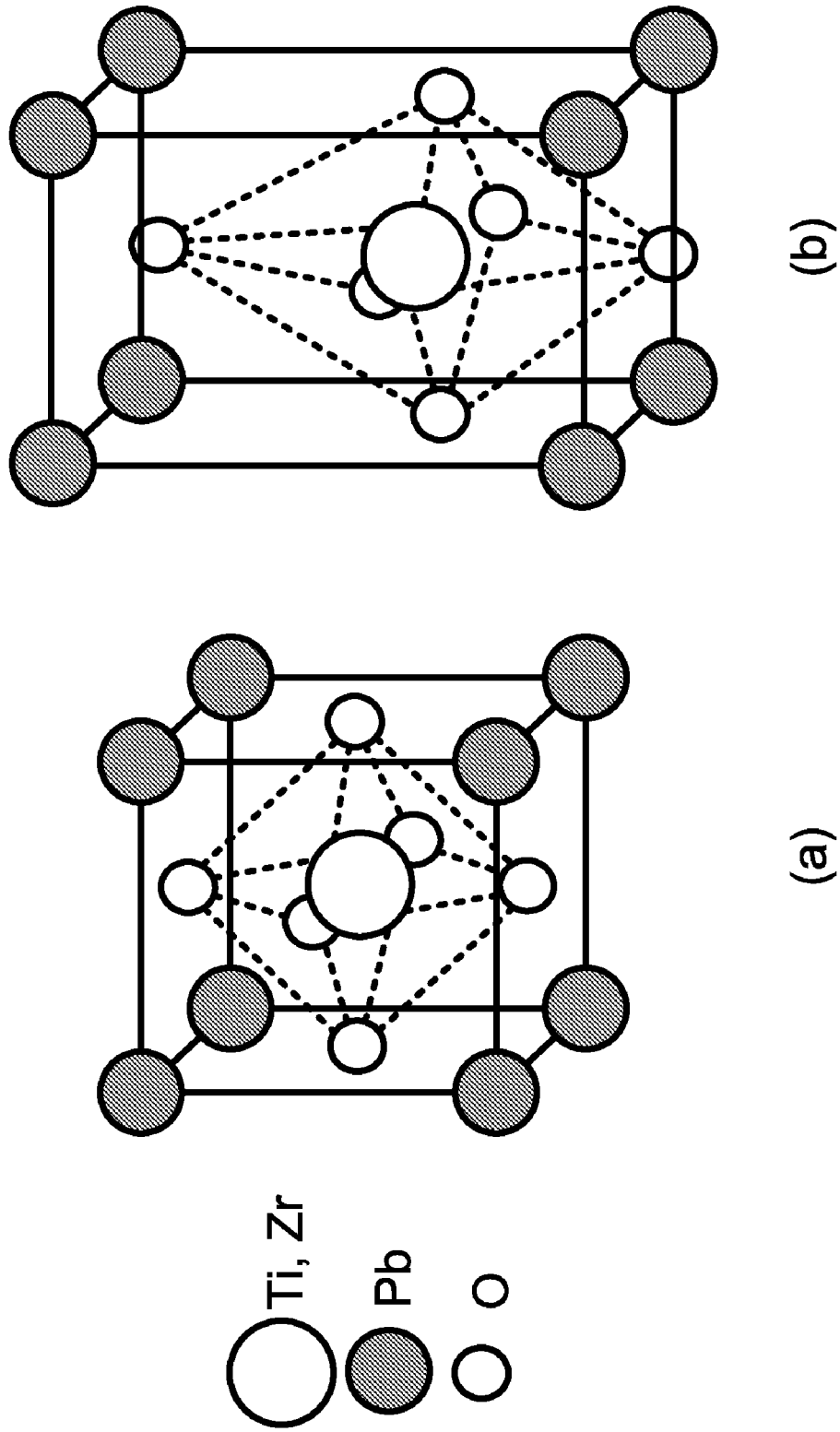
FIG. 14 illustrates schematically the shift from (a) the paraelectric cubic state of a Perovskite crystal to (b) the tetragonal configuration, the latter reflecting the ferroelectric state with displaced ions that arise from deformation of the unit cell, thereby making the unit cell an electric dipole, which in the aggregate with the other dipoles throughout the material give rise to spontaneous polarization $P_s$.
Figure 15:
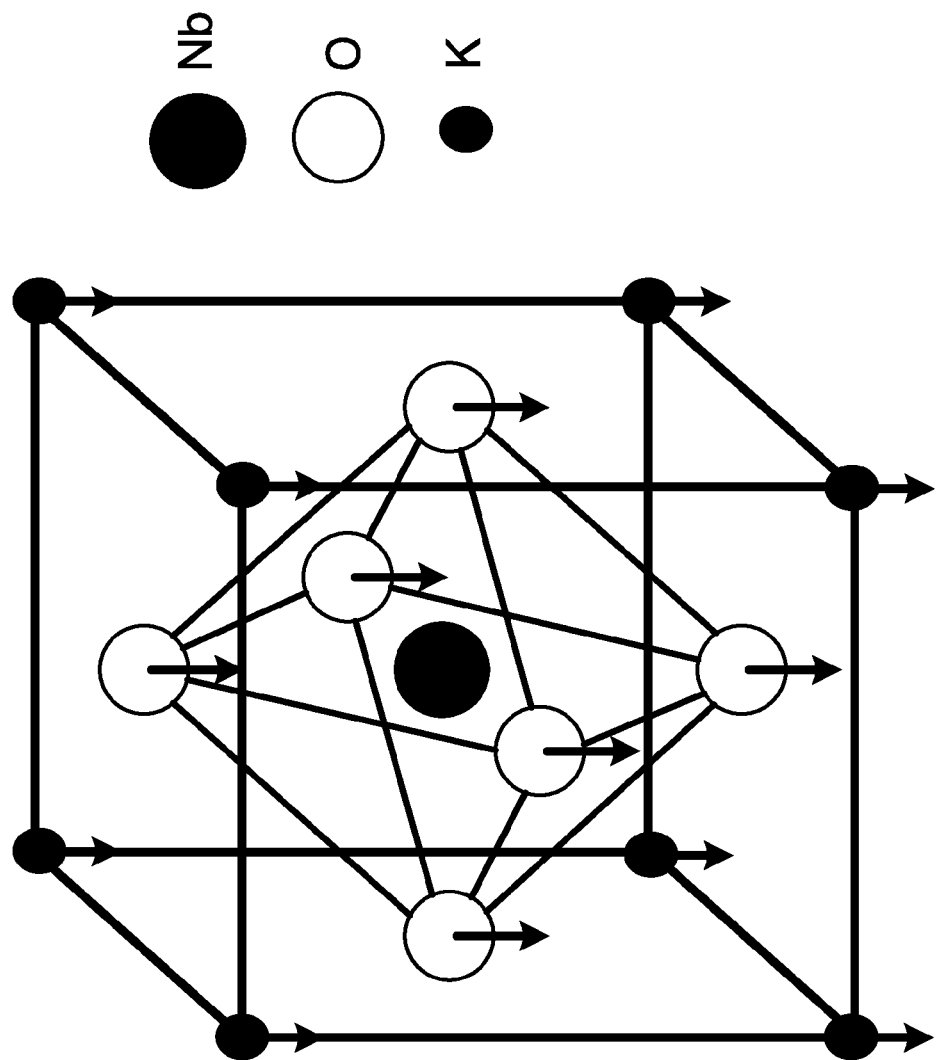
FIG. 15 illustrates schematically the displacement of potassium and oxygen ions on the corners and faces, respectively, of $KNbO_3$ in the ferroelectric state, where the ionic displacement creates spontaneous polarization.

As used herein, the term "unit cell" refers to a crystal structure that is a unique arrangement of atoms in a crystal. A crystal structure is composed of a motif, a set of atoms arranged in a particular way, and a lattice. Motifs are located upon the points of a lattice, which is an array of points repeating periodically in three dimensions. The points can be thought of as forming identical tiny boxes, called unit cells, that fill the space of the lattice. The lengths of the edges of a unit cell and the angles between them are called the lattice parameters. The crystal structure of a material or the arrangement of atoms in a crystal structure can be described in terms of its unit cell. The unit cell is a tiny box containing one or more motifs, a spatial arrangement of atoms. The unit cells stacked in three-dimensional space describe the bulk arrangement of atoms of the crystal. The crystal structure has a three dimensional shape. The unit cell is given by its lattice parameters, the length of the cell edges and the angles between them, while the positions of the atoms inside the unit cell are described by the set of atomic positions measured from a lattice point. Examples of unit cells are illustrated in FIGS. 14 and 15.

As used herein, the term "Curie temperature" or $T_c$ refers to a characteristic property of a ferroelectric material. At temperatures below the Curie temperature, the ferroelectric material generally is in a ferroelectric phase in which spontaneous polarization is established in the unit cells of the ferroelectric material. As the temperature is increased towards the Curie temperature, the spontaneous polarization established in the unit cells decreases. Above the Curie temperature, the ferroelectric material is generally in a paraelectric phase in which spontaneous polarization is not established in the unit cells of the ferroelectric material. There are ferroelectrics, however, where a ferroelectric phase exists at temperatures above the transition temperature, and the material is paraelectric below that transition temperature. Also, there are transition temperatures between ferroelectric and antiferroelectric phases that are relevant to the invention, as described herein, and the ferroelectric phase may occur at a higher temperature than the antiferroelectric phase. There does not appear to be a clearly established usage as to whether "Curie temperature" also applies to the transition temperatures for these latter kinds of phase transitions. The terms "phase transition temperature" and "transition temperature" are used herein to include all of the foregoing types of phase transitions. "Curie temperature" or $T_c$ may be used only in conjunction with the first type of phase transition, or it may be used more broadly when apparent from the context.

In practice, for all of the above described types of phase transitions, the sharpness of the phase change as the material temperature crosses the transition temperature is determined by the homogeneity of the composition and the crystal structure, such that the transition between phases may take place progressively as the temperature of the ferroelectric material increases or decreases over a temperature range around the designated transition temperature of the material.

Whenever the use of ferroelectric materials are disclosed herein, it is intended that such use include both ordinary and improper ferroelectrics, with the ferroelectric material being cycled with respect to its phase transition as described.

In addition to ferroelectric materials with a crystal structure, amorphous materials that are polarizable can be used with the invention. Some such materials provide a very robust basis for converting thermal energy to electricity. For such amorphous materials, the depolarization transition temperature is analogous to $T_c$ or the ferroelectric phase transition temperature as described above. Whenever the use of ferroelectric materials are disclosed herein, it is intended that that use include the cycling of such polarizable amorphous materials. In that instance, the polarizable amorphous material is cycled like the ferroelectric material, with the depolarization transition temperature being used in the cycle in lieu of the ferroelectric phase transition temperature.

Various polarizable amorphous materials are of particular utility with the invention because their depolarization transition temperatures are in a useful range for many applications, generally less than ~250° C., although they may also be at greater temperatures, and they produce a robust discharge of electrical energy when cycled. The relationship between energy, polarization, and permittivity is:

$$U = P^2 / 2 \epsilon \epsilon_0.$$

While P is generally smaller with such amorphous polymers than is the case, for example, with ferroelectric ceramics, the permittivity for such materials is much smaller, yielding a high energy density, U.

Examples of polarizable amorphous materials that can be used with the invention include MXD6 Nylon, which has a transition temperature of approximately 78 C and has produced measured discharge voltages of approximately 800 V for a sample 70 μm thick. A PANMA-4 acrylonitrile copolymer sample 50 μm thick has produced a discharge voltage of approximately 1,300 V with a transition temperature of approximately 100 C.

On occasion, "polarization" is used herein where it might be more precise to refer to "electric displacement." Since there is no significant difference between the terms in this context, polarization is used throughout for simplicity and clarity.

Without intent to limit the scope of the invention, exemplary apparatuses and methods and their related results according to the embodiments of the present invention are given below. Note that titles or subtitles may be used in the examples for convenience of a reader, which in no way should limit the scope of the invention. Moreover, certain theories are proposed and disclosed herein; however, in no way, whether they are right or wrong, should they limit the scope of the invention so long as the invention is practiced according to the invention without regard for any particular theory or scheme of action.

In accordance with the purposes of this invention, as embodied and broadly described herein, this invention, in one aspect, relates to an apparatus and method for converting thermal energy directly to electrical energy through a ferroelectric medium without the energy passing through intermediate mechanical mechanisms or through other forms. The invention exploits the large inherent spontaneous polarization that develops in ferroelectric materials when they are in their ferroelectric phase. The spontaneous polarization that arises in the unit cells of ferroelectric materials or other polarizable materials, which is exploited by the invention, occurs without application of an external E field. The unit cell polarization occurs spontaneously as a result of the material transitioning into a ferroelectric phase. The powerful spontaneous polarization of the unit cells produces a large overall net polarization in the ferroelectric material as a whole when the unit cells and domains are aligned by poling. The invention further exploits the large changes in overall net spontaneous polarization that occur when a change in the temperature of the ferroelectric material causes a transition to a phase that has negligible net polarization.

The invention permits the removal and use of the electrical energy generated by the spontaneous polarization that occurs when the material is in the ferroelectric phase. The electrical energy so generated can be exported to external circuitry in conjunction with phase transition of the material from the ferroelectric phase to a non-polar phase. The inherent net spontaneous polarization, $P_s$, disappears as the material transitions to a non-ferroelectric phase. Commonly, the phase transition that renders $P_s$ negligible will be from the ferroelectric phase to the paraelectric phase, but it may also be from the ferroelectric phase to the antiferroelectric phase, since the antiferroelectric phase produces negligible net spontaneous polarization in the material overall.

To allow the conversion of thermal energy to electrical energy with the invention, the basic ferroelectric module is cycled around its phase transition temperature. That temperature cycling is accomplished by one or more heat exchangers that interface between the ferroelectric module and a heat source and heat sink. The heat exchangers and heat source are not limited and may include any mode by which thermal energy is transferred, including convective, conductive and radiative transfer, and one and two-phase thermal transfer systems. The invention can be used generally to convert thermal energy where: (1) at least a portion of the temperature range between the heat source temperature, $T_H$, and heat sink temperature, $T_L$, are within the range of phase transition temperatures for one of the many ferroelectric materials that exist; and (2) the temperature difference, $\Delta T = (T_H - T_L)$, is sufficient to allow effective conversion for the particular application.

There are ferroelectrics with phase transition temperatures that range from as low as about 0° C. to as high as about 700° C., and the invention can be operated in that range with such ferroelectrics. There is no theoretical limit to the operating temperature of the apparatus or method, and it can also be used at temperatures below 0° C. and above 700° C. insofar as appropriate ferroelectrics are available.

The magnitude of the temperature difference, ΔT, that may be sufficient to use the device depends largely on practical issues, such as the efficiency desired for an application. For a ferroelectric material in which the phase transition substantially occurs over, say, a temperature difference, ΔT, of 1° C., the device may be used to generate electrical energy from a heat source and sink with a ΔT of that magnitude, provided $T_H$ and $T_L$ bound the phase transition temperature. The practical utility of operating with such a small temperature difference will be constrained by the Second Law of Thermodynamics. The maximum possible conversion efficiency of available thermal energy in any context is given by the Carnot efficiency, whereby $\eta_c = \Delta T / T_H$. Thus, the magnitude of the temperature difference, ΔT, desired to operate the device in a practical application will depend upon the specifics of the application; engineering parameters or constraints associated with the application; the characteristics of the heat source and heat sink; the heat flux; the performance characteristics of the particular ferroelectric(s) that has the necessary phase transition temperatures; economic considerations; the practical importance of generating electricity from the particular heat source; and other considerations. While a temperature difference $\Delta T \geq 5°$ C., for example, may generally permit effective use of the invention, the temperature difference may need to be greater, or it could be less, for a particular application and materials system, based on the factors stated, among others.

It will be recognized by persons skilled in the art that some temperature gradient will exist between the ferroelectric material and the heat source that is at $T_H$ and the heat sink that is at $T_L$. While that gradient is often disregarded in quasistatic thermodynamic analyses that assume an ideal isothermal heat transfer between the working medium—which here is the ferroelectric—and the heat source and sink, the flow of heat requires some gradient in practice. For simplicity, that gradient is disregarded here and $T_H$ may be used to designate both the temperature of the heat source and the temperature to which the ferroelectric is heated. Similarly, $T_L$ may be used to designate both the temperature of the heat sink and the temperature to which the ferroelectric is cooled. In practice, the extent of the actual gradient may affect the overall thermal efficiency, power density, and other factors.

The invention is not limited or specific to any particular heat exchanger format or configuration; to any particular heat source or heat sink; nor to any particular thermal characteristics of the heat source or heat sink. Rather, the device is general and may be used to effectively convert available thermal energy to electricity and, conversely, to cool using electrical energy. Heat input and withdrawal to and from the ferroelectric to cause temperature and phase cycling can be accomplished by thermal transport through convection, conduction or radiation, and by one or two-phase heat transfer systems.

In general, different materials can be used to practice the present invention. A particular ferroelectric will be effective in converting heat to electrical energy when cycled around its phase transition temperature or temperatures. As noted, the phase transition that often will be utilized with the invention is that from ferroelectric to paraelectric and back to ferroelectric. However, the phase transition from ferroelectric to antiferroelectric and back may also be utilized with the invention. First order transitions are common among ferroelectric materials, and many first order transition materials are appropriate for use with the invention. Ferroelectric materials that exhibit second order transitions may also be used with the invention.

Criteria that affect the suitability of a ferroelectric material for a particular application include: (1) a phase transition temperature that matches the available range of thermal energy from the heat source and heat sink; (2) the sharpness of the phase transition of that material as a function of temperature; (3) the energy released during transition from a polarized state to a non-polarized state, as expressed by $U = P^2 / 2\epsilon\epsilon_0$ (with high permittivity ferroelectrics, spontaneous polarization in the ferroelectric state is preferably $\geq 2$ μC cm$^{-2}$, but amorphous polymers with much lower polarization may be used since they may have very low permittivity); (4) a sufficiently high resistivity to avoid the charges on the electrodes from leaking through the ferroelectric medium before the stored electrical energy can be removed externally at high voltage; and (5) a comparatively high ferroelectric transition energy, or enthalpy, in comparison to the energy required to heat the lattice during cycling (this factor will depend in part on the magnitude of the temperature difference between the high and low cycling temperatures).

Lead based ferroelectric materials systems, for example, provide a wide range of materials combinations, such as PZT, PZST, PLT, etc., that may be used. The particular percentage compositions of the constituent elements will affect the specific performance characteristics of the material, including the phase transition temperature. In polymer systems, the phase transition temperature can be varied and controlled by forming copolymers and blends. A list of many ferroelectrics and antiferroelectrics that may be used with the invention is set forth in M. Lines and A. Glass, PRINCIPLES AND APPLICATIONS OF FERROELECTRICS AND RELATED MATERIALS, APP. F (1977, Oxford reprint 2004), though the list is not exhaustive. That Appendix F is incorporated herein. The invention can be used with ferroelectrics that are in either solid or liquid form, the latter including, for example, liquid ferroelectrics and ferroelectric fine crystals suspended in a liquid appropriate for a particular application. The solid materials that can be used include ceramic ferroelectrics, ferroelectric polymers, and other polarizable polymers by way of example.

Figure 16:
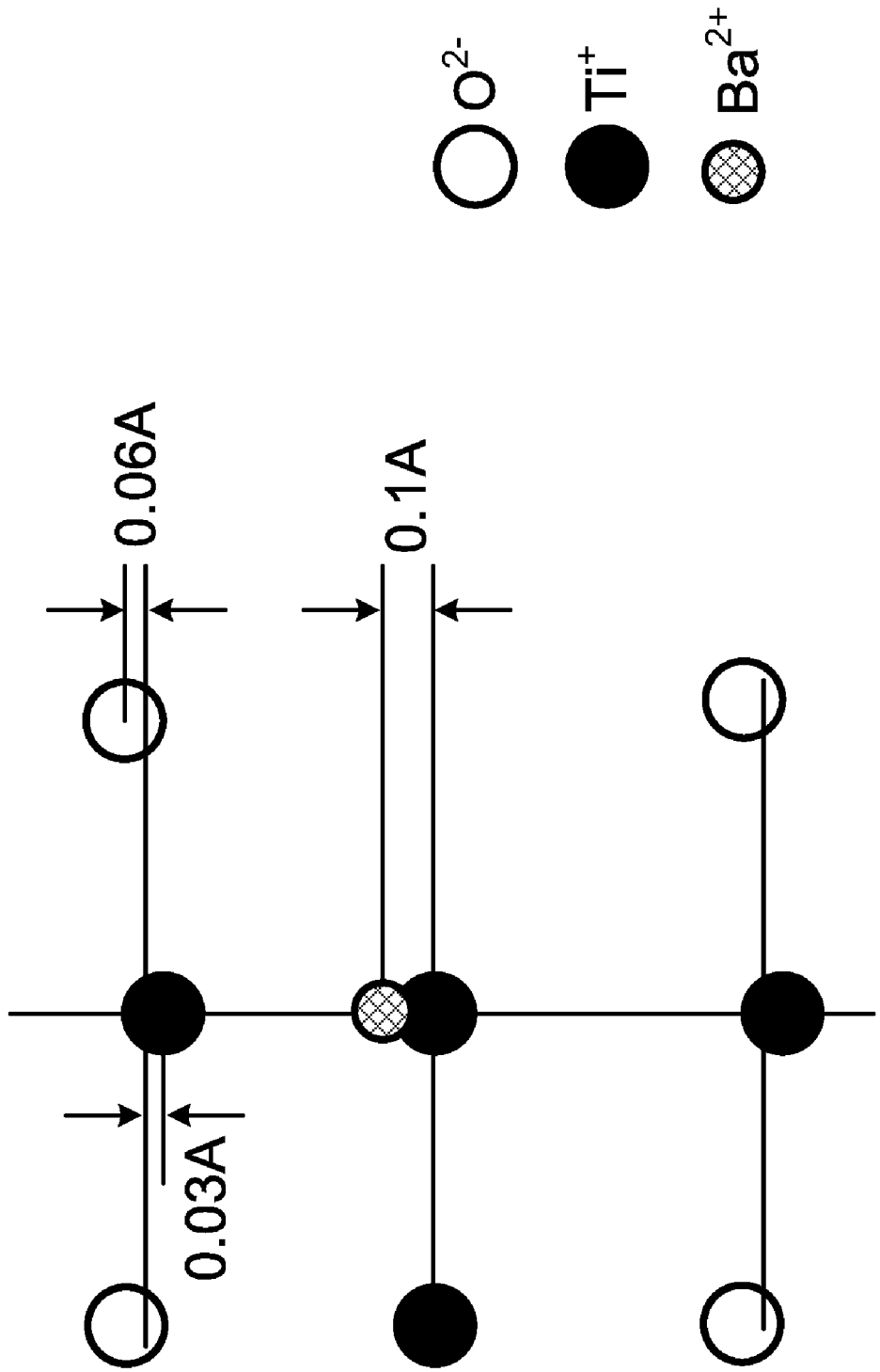
FIG. 16 illustrates the magnitude of the ionic displacements that occur in the unit cell of the Perovskite barium titanate, $BaTiO_3$, when in the ferroelectric phase and that give rise to spontaneous polarization, $P_s$.

By way of example, a number of Perovskite crystals exhibit phase transition phenomena that provide an effective ferroelectric to be used in the invention. Perovskite ferroelectrics, such as PZT or PLT, undergo mostly first order transitions from the ferroelectric to paraelectric phase when the unit cell structure undergoes transition from cubic (paraelectric phase) to tetrahedral (ferroelectric phase). FIG. 14(a) illustrates the unit cell structure for a Perovskite crystal in the paraelectric phase where the material temperature is great than $T_c$. In the example, the eight corners of the cube are occupied by lead atoms; the six faces of the cube are occupied by oxygen atoms; and the center of the cube is occupied by a titanium or zirconium atom. FIG. 14(b) depicts the shift in the relative positions of the ions when the material is in the ferroelectric phase and $T < T_c$. It is that shift that gives rise to the local electric dipole of the unit cell, and it is those electric dipoles that, in the aggregate, produce the spontaneous polarization of the ferroelectric material, $P_s$. FIG. 15 is a similar illustration of displacement and unit cell polarization for another ferroelectric, potassium niobate, $KNbO_3$, when in the ferroelectric phase. FIG. 16 illustrates the magnitude of the physical displacement, in angstroms, that may occur among the ions in the unit cell in the ferroelectric phase, which displacement gives rise to the unit cell electric dipole.

Referring to FIG. 1, a single-stage ferroelectric conversion device/apparatus 100 that utilizes the change in spontaneous polarization that occurs from temperature cycling to generate electric charges that are discharged to an external circuitry at high voltage is schematically shown according to one embodiment of the present invention. The apparatus 100 includes a ferroelectric layer 110 having a first surface 112 and an opposite, second surface 114. The ferroelectric layer 110 consists of a solid or liquid ferroelectric material that is characterized by a phase transition temperature at which the material undergoes a phase change from the ferroelectric phase to either the paraelectric or antiferroelectric phase and back again as the temperature change is reversed. The ferroelectric layer 110 may consist of a ferroelectric material that is characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature, $T_c$, spontaneous polarization is not established in the unit cells of the ferroelectric material or is negligible. The ferroelectric layer 110 may also consist of a ferroelectric material that undergoes phase transition from ferroelectric to paraelectric as the temperature of the ferroelectric material decreases below the transition temperature. The ferroelectric layer 110 may also consist of a ferroelectric material that undergoes phase transition from the ferroelectric phase to the antiferroelectric phase at a phase transition temperature, such material changing back to the ferroelectric phase when the temperature change is reversed. The ferroelectric layer 110 has a thickness defined between the first surface 112 and the second surface 114. The thickness required in practice depends upon several parameters including the particular application and the characteristics and amount of heat available to be converted to electricity; the particular ferroelectric material utilized; and the thermal conductivity of the ferroelectric material. Typically, the thickness of the ferroelectric layer 110 in one stage of the apparatus 100 is between about 0.01 mm and about 1 cm. Other values of the thickness can also be utilized to practice the invention. The ferroelectric layer 110 may be planar in shape or of any other shape, its configuration being limited only by manufacturing technology and operational considerations for the device.

The width and length of the ferroelectric layer 110 is determined by the nature of the ferroelectric material, the particular application, the characteristics and amount of heat available to be converted to electricity, the heat transfer mechanism, and other factors. There is no theoretical limit on the width and length of the ferroelectric layer 110. Limitations are practical manufacturing limitations that may exist from time to time for a particular ferroelectric material and operational factors of a particular application. Where the width and length of the ferroelectric layer 110 is limited by practical considerations, a number of similar or identical devices can be arranged in an array or in a stack to effectively expand the surface available for communication with the heat exchangers that interface the device depicted in FIG. 1 with the heat source and heat sink. In such an application, the conductive leads from the electrodes may be joined to electrical buses, and the cumulative array would then act as a larger device having an area approximately equal to the total area of the individual devices, thereby permitting generation of electric power limited only by the quantity and character of the available thermal energy. One example of such an array is illustrated by FIG. 8.

A pair of electrodes 122 and 124 is respectively positioned on the first surface 112 and the second surface 114 of the ferroelectric layer 110. The electrodes 122 and 124 consist of a thermally and electrically conductive material. Such electrodes 122 and 124 are substantially in contact with the first and second surfaces 112 and 114 of the ferroelectric material/layer 110 so as to provide electrical contact and maximize thermal conductivity. The pair of electrodes 122 and 124 may be comprised of, for example, a thin coating of silver of a thickness sufficient to permit the conduction of the current that is generated, but sufficiently thin to minimize interference with thermal conductivity between the heat exchangers and the ferroelectric material. The thickness of the silver electrodes can be about 1-5 microns, for example. In some embodiments, it may be desirable to have the electrode set back slightly from the edges of the ferroelectric layer 110 by, for example, 1 mm, to avoid electrical discharge around the edge of the ferroelectric layer 110.

Additionally, the apparatus 100 includes means positioned in relation to the pair of electrodes 122 and 124 for alternately delivering 140 heat to and from the first surface 112 and the second surface 114 of the ferroelectric layer 110 so as to alternately cool the ferroelectric layer 110 at a first temperature $T_L$ that is lower than the transition temperature, and heat the ferroelectric layer 110 at a second temperature $T_H$ that is higher than the transition temperature, so that the ferroelectric material of the ferroelectric layer 110 thereby undergoes, with temperature cycling, alternating phase transitions between (1) the ferroelectric phase and (2) the paraelectric or antiferroelectric phase. In this exemplary embodiment, the delivering means comprises two heat exchangers 132 and 134 in fluid communication with a heat source and a heat sink (not shown) for inputting heat from the heat source to the ferroelectric layer 110 so as to heat the ferroelectric layer 110 at the second temperature $T_H$, and withdrawing heat from the ferroelectric layer 110 to the heat sink so as to cool the ferroelectric layer 110 at the first temperature $T_L$. This absorption and rejection of thermal energy is integral to satisfying the Second Law of Thermodynamics, which permits conversion of thermal energy to another form of energy, or to work, only through a process of heat absorption and heat rejection.

The apparatus 100 also has a pair of electric leads 152 and 154 electrically connected to the pair of electrodes 122 and 124, respectively, such that when the ferroelectric material of the ferroelectric layer 110 is in a metastable state, the circuit can be closed. Poling the domains of the ferroelectric material enables a very large overall net spontaneous polarization to develop in the ferroelectric layer as it transitions from a metastable state to a stable ferroelectric state. That overall net spontaneous polarization in turn induces very dense electrically-opposite screening charges respectively on the pair of electrodes 122 and 124. With this invention, the poling field is established by a residual charge on the electrodes that remains after the electrical discharge step of the cycle. In previous inventions, the poling field was provided by an external DC voltage that was applied during each cycle, for example, U.S. Pat. No. 7,982,360. While such a DC voltage is thus not normally applied during cycling according to the present invention, such a voltage source should still be available to establish a poling field for the initial cycle and in the event the residual charge is allowed to diminish during operation below what is required to establish a poling field.

The present invention can be used for poling ferroelectric materials during cycling generally as, for example, with the general cycle disclosed in U.S. Pat. No. 7,982,360. Poling is performed by a field resulting from residual free charges left on the electrodes after discharge that establish an internal field sufficient to pole the spontaneous dipoles. The minimum value of polarization —i.e., $P_L$—that corresponds to that residual charge is determined by the value of P that occurs at the local free energy maximum for a given cycle. With $P_L$ exceeding that value, the system can relax spontaneously without application of an external poling field, and the material system achieves a large overall net sponateous polarization. In one embodiment using the cycle disclosed in U.S.

patent application Ser. No. 13/226,799, which is incorporated herein, the circuit is opened while the ferroelectric material of the ferroelectric layer 110 is heated to temperature $T_H$ through the addition of heat to the lattice, while total polarization remains constant at $P_H$ because the circuit is open so as to prevent discharge of the charges on the electrodes. The circuit is then closed while heat is added to the ferroelectric layer isothermally, causing the electrically-opposite screening charges to discharge to the pair of electric leads 152 and 154 at a very high voltage. The pair of electric leads 152 and 154 permits the conduction of the discharge current from the electrodes to whatever external load may be used or to busses to collect and distribute the electricity generated by multiple devices. An external applied voltage is not needed between the pair of electric leads 152 and 154 other than during the first cycle and incidental use in subsequent operation as described herein.

Figure 21:
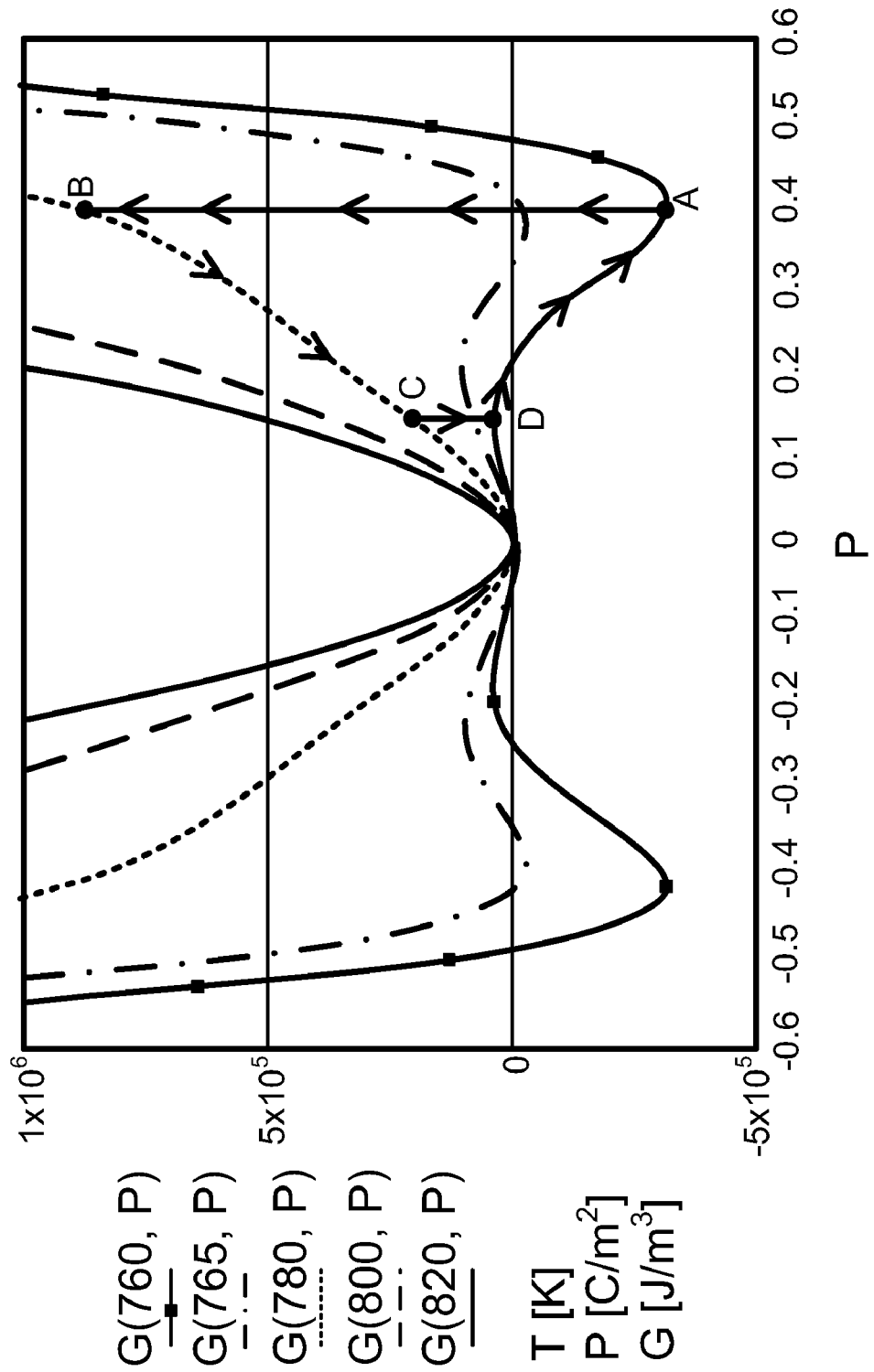
FIG. 21 is a plot of free energy for various temperature values as a function of polarization. Superimposed on the plot are the steps of a thermodynamic cycle that is disclosed by the present invention. Polarization is a full thermodynamic variable, and it represents the full polar system described by G(T, P).
Figure 22:
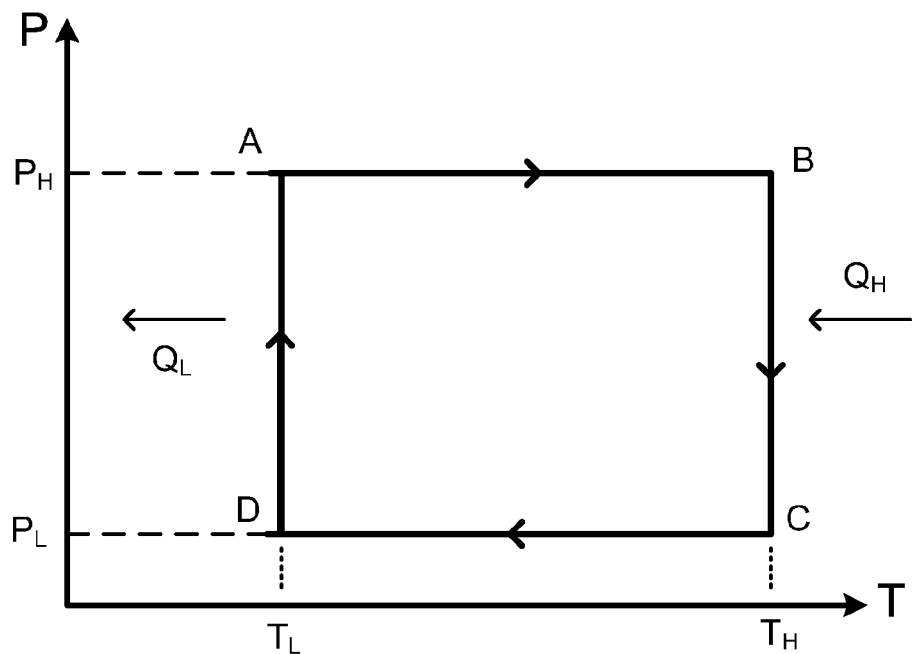
FIG. 22 is an illustration of a thermodynamic cycle of a ferroelectric wherein two steps are isothermal and two are iso-polarization. $Q_L$ and $Q_H$ indicate the removal and addition of heat, respectively, during the isothermal steps.

When poling is achieved by the field that results from the residual unscreened charges on the electrodes 122 and 124, a current will flow between those electrodes in response to the change in net spontaneous polarization that occurs in the ferroelectric layer. That current can be exploited as an additional source of electrical energy output to the external load. This energy output during relaxation of the system from a metastable to a stable state is depicted by the downhill relaxation between points D and A in the free energy plot of the $T_L$ isotherm shown in FIG. 21. This occurs at $T_L$ as $Q_L$ is being removed from the ferroelectric layer. In one embodiment, the direction of the current during the DA portion of the cycle can be made to coincide with the direction of the current during the primary discharge (step BC as depicted in FIG. 22 and described elsewhere) by causing the current during the DA step to pass through a full-wave rectifier (not shown) that is also included in the circuit when the switch S1 is in position B. Such a rectifier may, for example, be a bridge circuit. The rectifier causes current flows to and from the electrodes 822 and 824 to have the same direction at the load RL whether the current occurs during the BC or DA steps of the cycle.

Figure 2:
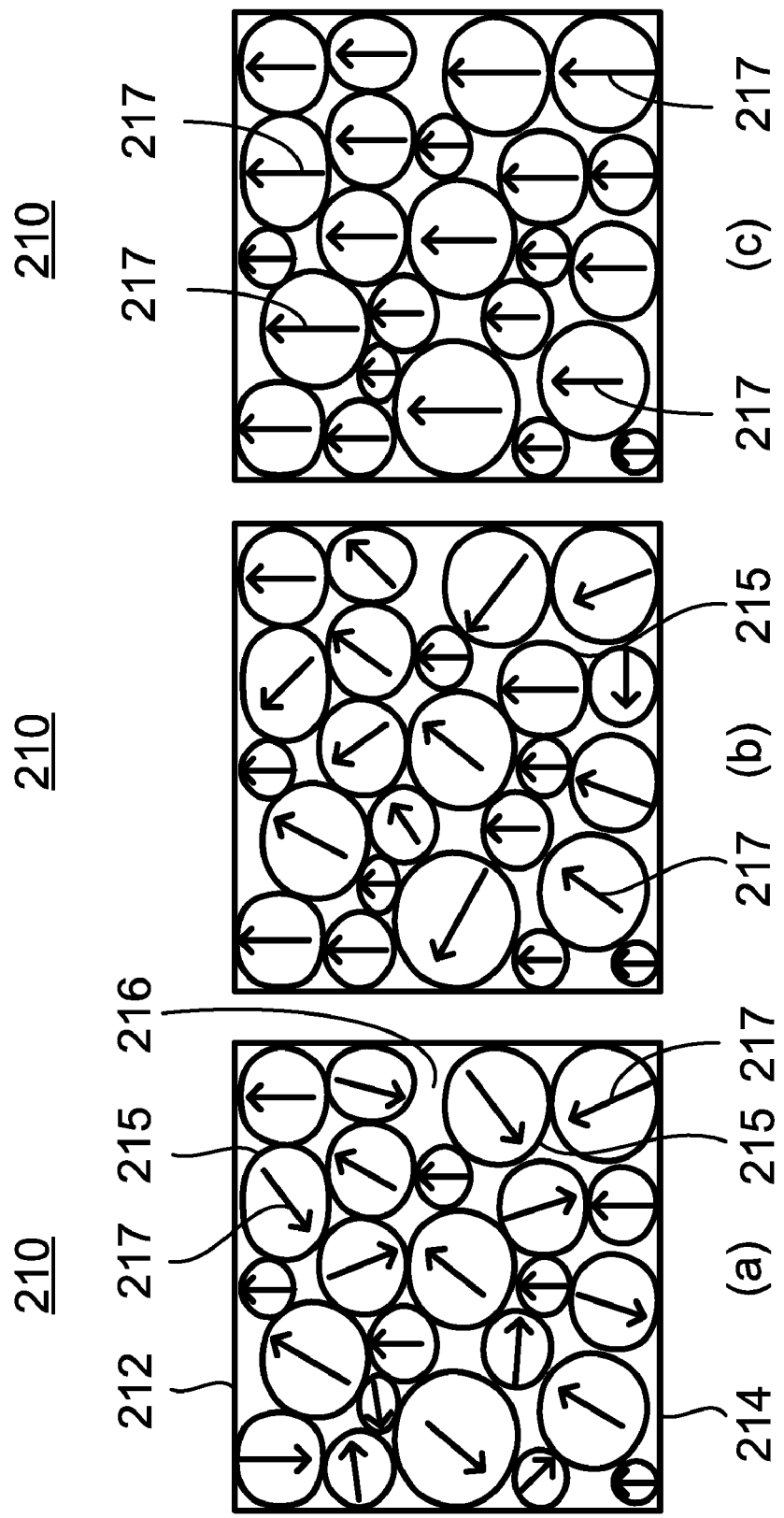
FIG. 2 illustrates schematically the alignment of the domains in a ferroelectric where (a) illustrates unpoled, random orientation, with each domain consisting of a large number of electric dipoles that would be similarly oriented within that individual domain; (b) illustrates a substantially poled material where the dipoles are oriented in the same overall direction; and (c) illustrates an ideal, completely poled ferroelectric that is generally attained only under special conditions pertaining to the atomic and molecular structure of the material.

FIG. 2 shows schematically the alignment of the domains 215 in a ferroelectric 210 in the ferroelectric phase, i.e., the temperature of the ferroelectric 210 is lower than the Curie temperature $T_c$, of the ferroelectric 210. The ferroelectric 210 has a first surface 212 and an opposite, second surface 214 defining a ferroelectric layer body 216 there between. The ferroelectric layer body 216 is characterized with a plurality of domains 215 having a large number of unit cells or polarizable units as in polymers. As shown in FIG. 2(a), each domain 215 is characterized by a spontaneous polarization indicated by a dipole arrow 217, but randomly orientated so that there is no overall net spontaneous polarization in the ferroelectric 210. FIG. 2(b) shows the dipoles 217 aligned towards the same overall direction, so that a very powerful net spontaneous polarization exists in the ferroelectric 210. Such alignment can be achieved by applying a poling field to the ferroelectric layer body 216. FIG. 2(c) illustrates an ideally aligned ferroelectric that generally is attained only under special conditions pertaining to the crystal structure of the material.

The electrical energy that can be extracted by exploiting changes in spontaneous polarization during thermal cycling of a given ferroelectric can be calculated from the Landau phenomenological model of material systems in and around phase change. Such modeling is a more comprehensive thermodynamic representation of the system than traditional quasi-static thermodynamic analysis. The latter is effectively restricted to equilibrium conditions, whereas Landau modeling is a broader dynamic representation that includes non-equilibrium conditions. For ordinary ferroelectrics, the Landau-Ginzburg-Devonshire free energy functional expresses the free energy of a ferroelectric material system in terms of the independent parameters temperature, T, and the order parameter, P, which represents the total polarization produced by the dipoles in the system, both spontaneous and induced. The Landau-Ginzburg-Devonshire free energy functional is expressed as:

$$G(T,P) = \alpha_1(T) \cdot P^2 + \alpha_{11} \cdot P^4 + \alpha_{111} \cdot P^6$$

where G is the free energy functional. G is in units of $J/m^3$, and P is in units of $C/m^2$. Polarization is a thermodynamic variable, and it represents the full polar system described by G(T, P). The $\alpha$ parameters are specific to a given material system, and for those given parameters, the Landau-Ginzburg-Devonshire free energy functional provides the full information for the thermal cycles of a ferroelectric through and around phase transition, and for polarizable polymer systems through and around their depolarization transitions.

Figure 17:
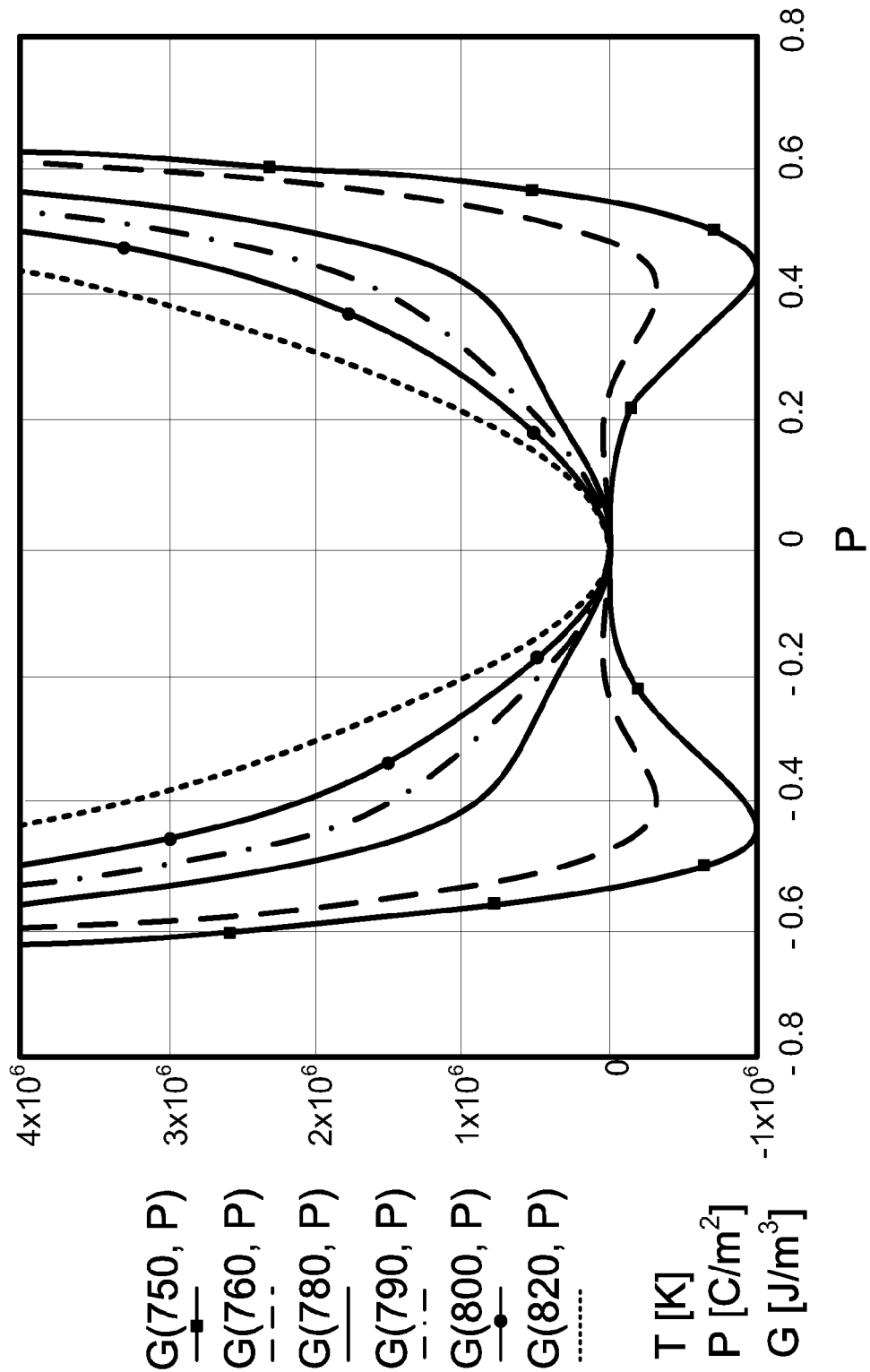
FIG. 17 is a plot of the free energy functional in terms of temperature, T, and polarization, P, using parameters for a sample of lead titanate, $PbTiO_3$. G is the Gibbs free energy. Temperature is measured in Kelvin; polarization in $C/m^2$; and the free energy, G, in $J/m^3$. Polarization is a full thermodynamic variable, and it represents the full polar system described by G(T, P).

FIG. 17 is an example of plots of the free energy functional in terms of temperature, T, and polarization, P, with the material parameters representative of a sample of lead titanate, $PbTiO_3$, with $T_c \cong 766$ K. Polarization is a full thermodynamic variable, and it represents the full polar system described by G(T, P). The individual plots are for various temperatures of the material. The free energy value, G, is measured in $J/m^3$. G is assigned the value of 0 when the material is in a nonpolar state—i.e., where P=0. The free energy, G, is then plotted as calculated from the Landau-Ginzburg-Devonshire functional for various temperature values from 750K to 820K. For temperatures above the transition temperature, the free energy is never below the reference value assigned for the material in the paraelectric state. The global minima in the various plots represent equilibrium states.

Where a material is in its ferroelectric phase, the system will have two free energy minima, one at each of the low points of the two wells. Each of those equilibrium points is equally likely in the absence of a field, and the decrease in free energy is the same in both wells because the material system is symmetrical. By poling the dipoles as the material system enters the ferroelectric phase, the system is biased so that the system will drop down into the particular well that corresponds to the poled orientation. Poling does not materially affect the free energy of the system.

Figure 18:
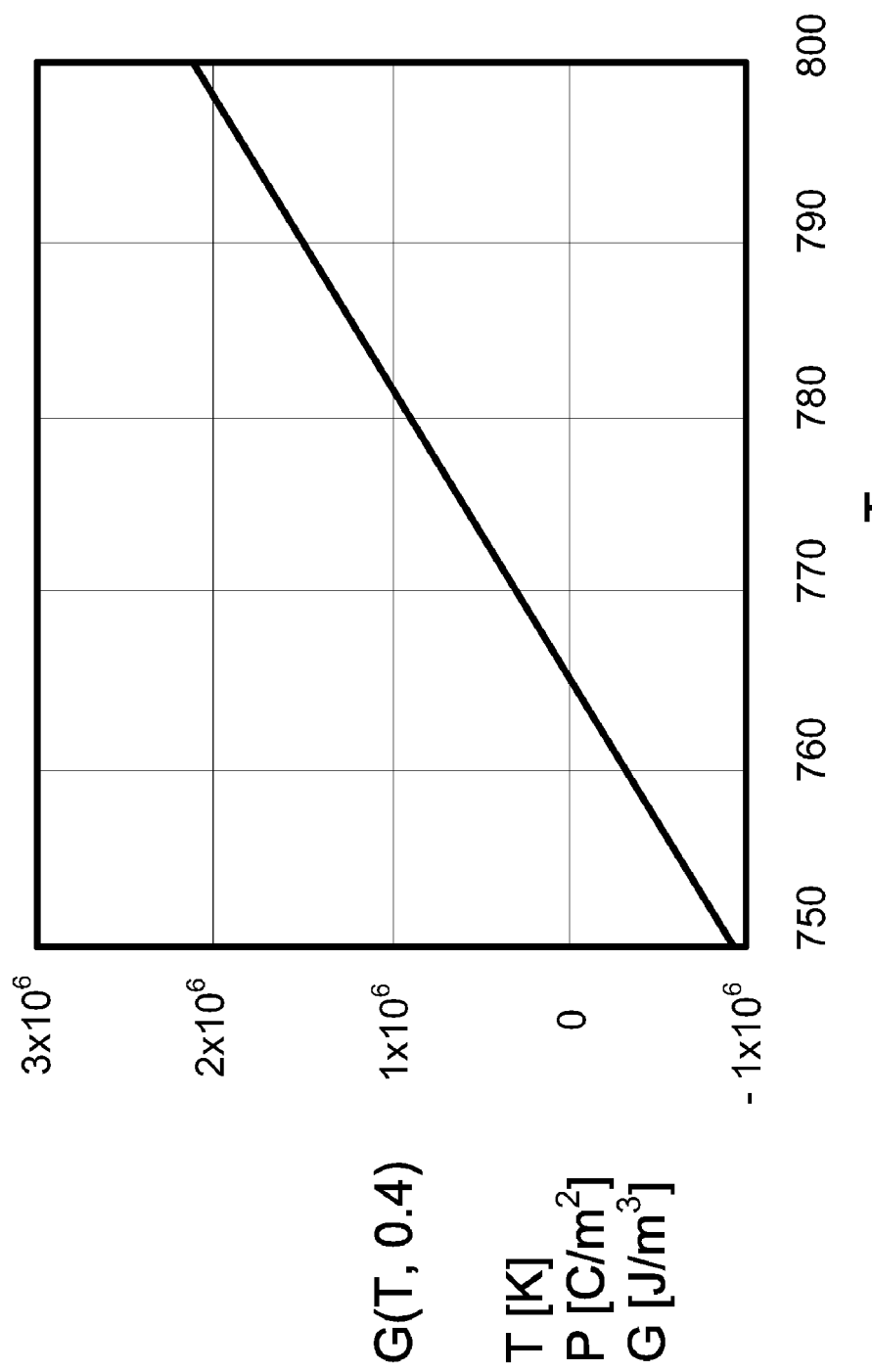
FIG. 18 is a plot of free energy as a function of temperature for a sample of lead titanate, $PbTiO_3$. Polarization is constant at $P=0.4$ $C/m^2$.

FIG. 18 is a plot of free energy as a function of temperature where polarization is held constant at 0.4 $C/m^2$. Again, the parameters used in plotting the free energy functional are those characteristic of a sample of lead titanate with $T_c \cong 766$ K. This linear relationship between free energy and temperature can be a consideration in determining the appropriate thermodynamic cycling of the ferroelectric material used in the invention. FIG. 18 indicates that it may be desirable in some instances to cycle the ferroelectric over a wide temperature range since the change in free energy increases as the temperature range of the cycle increases. Ideally, this can be performed as a perfect Carnot engine providing the highest possible efficiency. The thermal efficiency realized by cycling over the wider temperature range may decrease, however, because of increased lattice heat contribution for the wider temperature cycling if perfect regeneration cannot be performed. It should also be recognized that the accuracy of the Landau-Ginzburg-Devonshire model generally decreases as temperature departs farther from the phase change temperature, so the linear relationship may not be as accurate over large temperature ranges.

Figure 19:
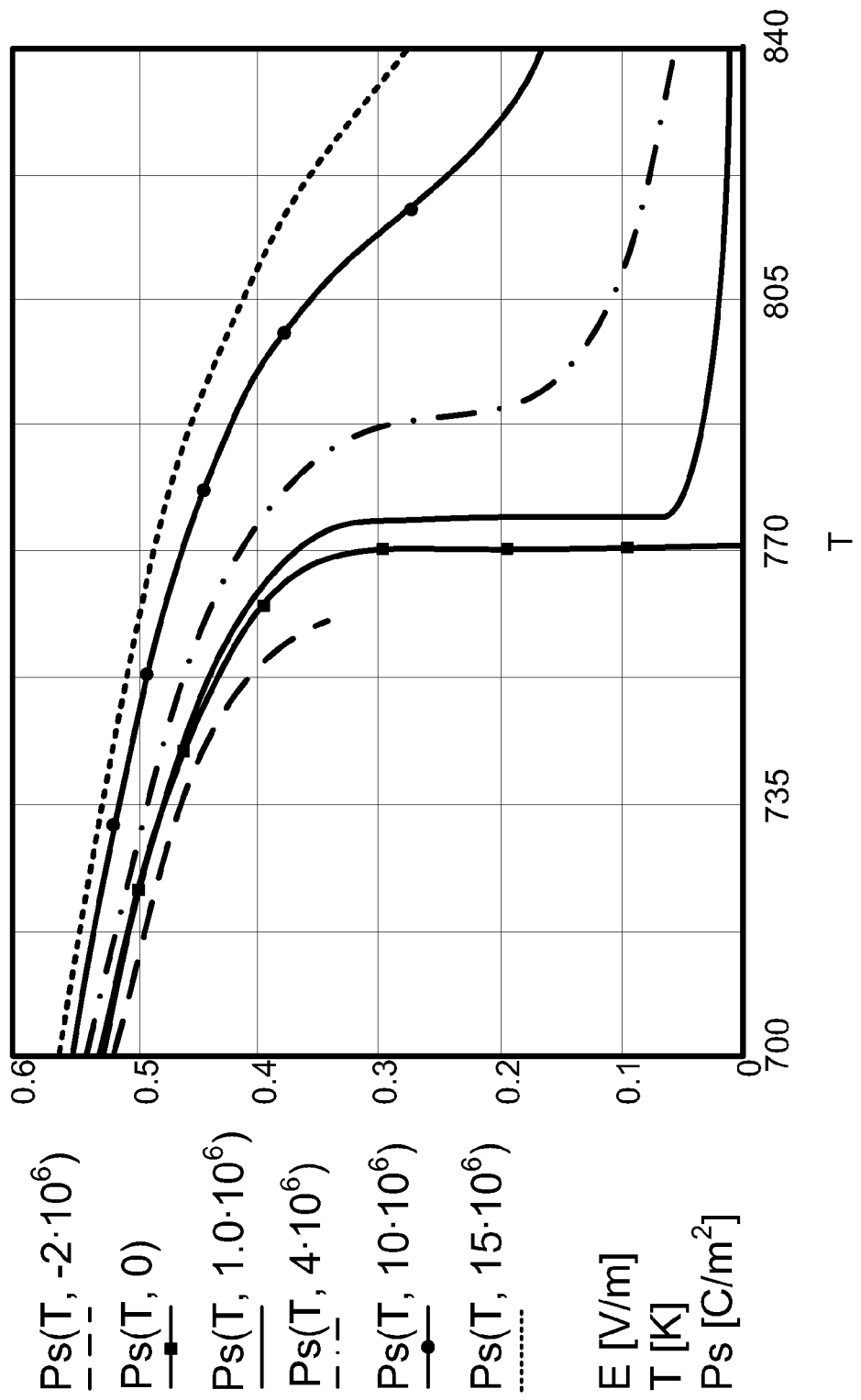
FIG. 19 is a plot of polarization at various electric field values, E. Temperature is measured in Kelvin, and the E field value is in volts per meter.

FIG. 19 presents plots of spontaneous polarization versus temperature for various electric field values for the same lead titanate parameters. The relationship between E; free energy, G; P; and T, is derived from the free energy functional and can be expressed as:

$$E=\partial G/\partial P=2\alpha_1(T)P+4\alpha_{11}P^3+6\alpha_{111}P^5.$$

In the case of the present invention, the E values represent the field generated by the unscreened charges on the electrodes. The electric field value E also includes the small poling field applied from the DC voltage source in the event an external poling field is applied.

Figure 20:
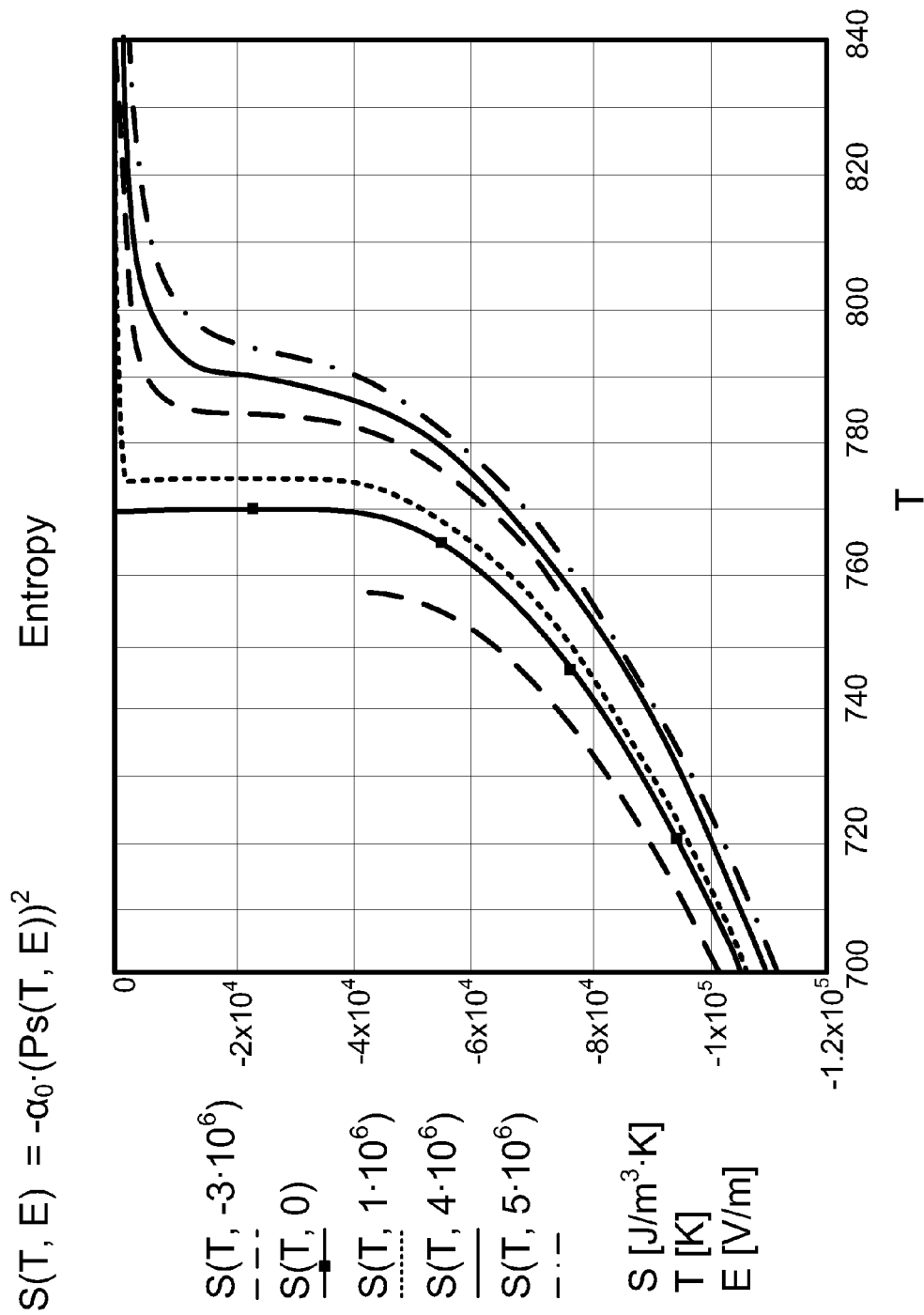
FIG. 20 is a plot of entropy for a sample of lead titanate, $PbTiO_3$, as a function of temperature for various E field values. Temperature is measured in K, and entropy is measured in units of $J/m^3 \cdot K$.

FIG. 20 is a plot of entropy, S, as a function of temperature for various E values where the parameter E is measured in volts per meter. Entropy is proportional to $P^2$, and $$S=-\alpha_0 \cdot [P_S(T,E)]^2$$

where entropy is measured in $J/(m^3 \cdot K)$. The parameter $\alpha_0$ is related to the material parameters by the expression $$\alpha_1=\alpha_0(T-T_0),$$

where $T_0$ is the Curie-Weiss temperature, which is the phase transition temperature for materials that have second order phase transitions, but has a different value for first order transition materials.

One thermodynamic cycle that can be used with the present invention is depicted in FIG. 22 in an ideal form. It has two isothermal steps, DA and BC, and two steps where polarization is held constant, CD and AB. Residual charges remaining on the electrodes after step BC of the cycle serve to pole the ferroelectric as it transitions back into the ferroelectric phase and total polarization increases. Such a cycle can be used to achieve a high output of electrical energy per cycle. The specific operation of this cycle is described in more detail herein.

As with any cycle using the present invention, the discharge of the electrodes is not complete at any point. Rather, a small unscreened residual charge is left remaining on the electrodes by opening the circuit before discharge is complete at point C. The impedances of the system and the load must be matched so that the depolarization field does not exceed the coercive field at any time after the external poling field is turned off. The amount of the residual charge left remaining is that which is sufficient to establish an internal poling field that will pole the spontaneous electric dipoles during transition into the ferroelectric phase. Other than as necessary to provide a poling field, it is generally desirable to allow for removal of the charges from the electrodes so as to maximize the amount of electrical energy withdrawn during that step of the cycle. The residual charge necessary to generate the internal poling field will depend on the material system, the configuration of the ferroelectric layer, and other factors. The value of $P_L$ is determined by the value of P that occurs at the local free energy maximum on the $T_L$ isotherm, plots of which are shown for various T values for one exemplary material in FIG. 21. By stopping discharge at point C of the cycle so that $P_L$ remains above the value of P at that local free energy maximum, the system relaxes spontaneously to point A while total polarization increases to $P_H$, without an externally applied poling field. By way of example, for a ferroelectric sample of $PbTiO_3$ at $T \cong 760$ K, $P_L \cong 0.15$ $C/m^2$ generally creates an adequate poling field, as indicated in FIG. 21.

Using the poling method of the present invention whereby the poling field is created by a residual unscreened charge remaining on the electrodes enhances the net energy output per cycle and the overall efficiency of the device in comparison to poling through application of a field applied from an external DC voltage source during each cycle.

Starting at an arbitrary point C of the specific cycle illustrated by FIG. 22, the material is at a relatively high temperature, $T_H$, and in a paraelectric or antiferroelectric phase. The electrodes on the surfaces of the ferroelectric have discharged at point C to the extent that only enough residual charge remains on the electrodes to provide a sufficient field for poling the ferroelectric when it is cycled back into its ferroelectric phase. The polarization value corresponding to that minimal poling field is designated as $P_L$. Then, during the CD step of the cycle, the ferroelectric is cooled to a relatively low temperature, $T_L$, while the electrical circuit is open so that total polarization remains constant at the minimum value, $P_L$. The heat withdrawn during the CD step corresponds to the sensible lattice heat to cool the material. The ferroelectric material is in a metastable state at point D.

The circuit is closed at point D of the cycle. During the DA step, heat $Q_L$ is withdrawn isothermally while the ferroelectric is at $T_L$ until the spontaneous polarization attains the maximum value, $P_H$. That value of $P_H$ may be as great as is permitted by the particular ferroelectric material system without causing electrical breakdown or significant electrical leakage through the ferroelectric layer. All other things being equal, attaining high $P_H$ values will generally correspond to larger output of electrical energy in each cycle. $P_H$ will vary depending upon the ferroelectric material system, the configuration of the ferroelectric layer and other factors. In the illustrative case of a lead titanate sample, $P_H$ may have a value of 0.4 $C/m^2$ as shown in FIG. 21.

During the DA step, the electrical circuit is closed so that a current flows from the electrode on one side of the ferroelectric to the electrode on the opposite side of the ferroelectric until screening charges develop that equal the opposing bound charges on the surfaces of the ferroelectric. Also during the DA step of the cycle, the small residual field resulting from the unscreened charges on the electrodes at point D causes the resulting dipoles to be oriented towards one direction—i.e., they become poled. The heat $Q_L$ withdrawn during the DA step corresponds approximately to the latent heat of the phase transition. During the DA step, the material system relaxes from a metastable state at point D to a stable state at point A. During the DA step, electrical power is generated with a current opposite in direction to that generated during step BC. The power generated during step DA can be discharged into external circuitry to perform electrical work. As noted elsewhere, there may be instances, such as the initial cycle, where poling may be achieved by application of an external field from a DC voltage source across the electrodes on the surfaces on the ferroelectric layer. On those occasions, electrical work is performed on the system rather than generated by the system.

In the next step of the cycle, AB, the circuit is open and the ferroelectric is heated to $T_H$ above the material transition temperature at constant polarization. The heat input during the AB step corresponds to the sensible lattice heat to heat the material to $T_H$. The same quantity of heat is input in this step as is removed in step CD to cool the lattice, thus permitting perfect regeneration and attainment of Carnot efficiency.

At point B of the cycle, the ferroelectric is again in a metastable state, and the circuit is closed. The heat $Q_H$ added during the BC step is equal to the enthalpy change that corresponds to the change in polarization. During that step, screened charges on the electrodes become unscreened and are largely discharged into external circuitry to perform electrical work. Total polarization at point C is reduced to $P_L$, at which point the circuit is opened to prevent further discharge of the unscreened charges on the electrodes. A control circuit operating under computer control is used to cause the addition and withdrawal of heat in accordance with the various steps of the cycle. The control circuit, acting under computer control, also causes the electrical circuit to open and close, in accordance with the cycle.

The transitions of the material system from the stable state to the metastable state or vice versa during the several steps of the cycle is well described by Landau-Khalatnikov time dependent phase transition theory, which can be used to match the response time of the load to the transition time from the metastable state.

$T_H$ and $T_L$ are above and below the transition temperature, respectively, so as to allow for phase change. Depending upon characteristics of the material, such as the homogeneity of the crystal structure, for example, $T_H$ and $T_L$ may differ from the transition temperature by a few degrees centigrade or less. $T_H$ and $T_L$ may also differ from the transition temperature by a substantial amount, for example, by 20 degrees centigrade or more.

It will be recognized by persons skilled in the art that the cycle illustrated in FIG. 22 depicts a cycle performing in an ideal fashion. In practice, there generally may be deviations from ideal or perfect isothermal or constant polarization steps of the cycle and deviations from perfect cycling between $P_H$ and $P_L$. It is not the intent of the invention to be limited to an ideal or perfect cycle, but instead to disclose the apparatus and method of poling by exploiting residual unscreened charges remaining on the electrodes as the source of the poling field. It should be recognized that the invention will generally be practiced such that actual poling may depart to some degree from the ideal.

As noted elsewhere, in some embodiments of the invention the ferroelectric phase occurs at a temperature higher than the transition temperature, and the paraelectric phase, or antiferroelectric phase, occurs below the transition temperature. In such embodiments, the cycle depicted in FIG. 22 operates the same except in the opposite direction. The four steps are DC, CB, BA, and AD. Steps DC and BA occur at constant polarization, $P_L$ and $P_H$, respectively. Only lattice heat is input and withdrawn, respectively, during steps DC and BA. Heat $Q_H$ is input isothermally during step CB, and heat $Q_L$ is withdrawn isothermally during step AD. During step CB, the electrical circuit is closed; poling occurs after the first cycle as a result of the field created by the residual charges; and a current flows from the electrode on one side of the ferroelectric to the electrode on the opposite side until screening charges develop that equal the opposing bound charges on the surfaces of the ferroelectric. The electrical circuit is closed and electricity is discharged to a load during step AD, discharge being stopped when $P_L$ is reached.

The robustness of a particular thermodynamic cycle can be evaluated using values calculated from the free energy functional. FIG. 21, like FIG. 17, is an example of plots of the free energy functional in terms of temperature, T, and polarization, P, with the material parameters representative of a sample of lead titanate, $PbTiO_3$, where $T_c \cong 766$ K. The individual plots are for various temperatures of the material. FIG. 21 includes designations of the points of the cycle (A, B, C and D) depicted in FIG. 22 and described herein with two isothermal steps and two steps where polarization is constant. The values for T and P in FIGS. 21 and 22 are illustrative only and are not intended to suggest that they are ideal or unique.

Figure 23:
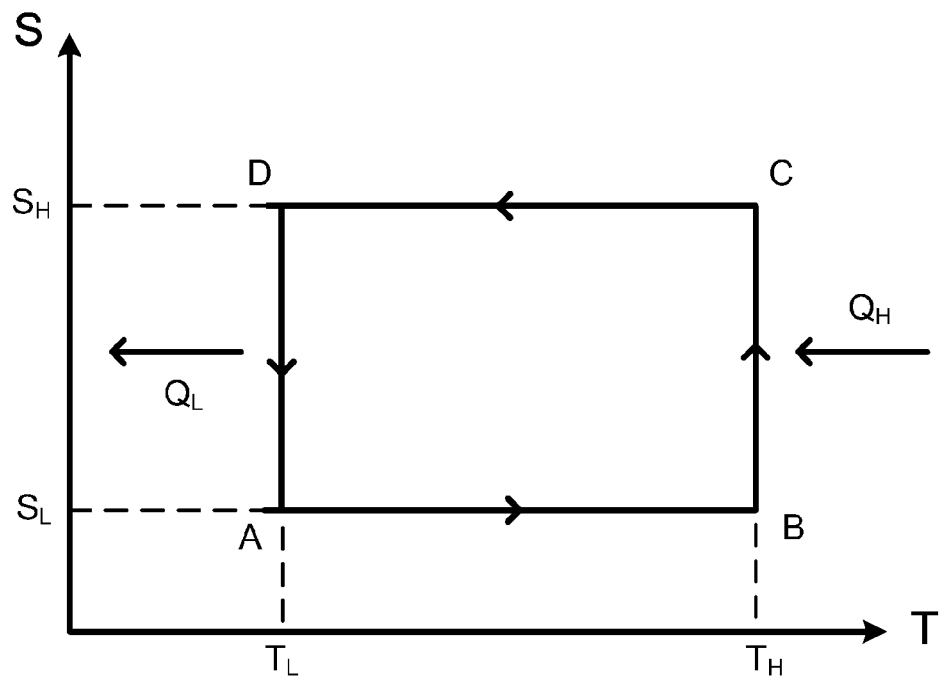
FIG. 23 illustrates entropy as a function of temperature for the cycle depicted in FIG. 22. Only the polarization contribution to free energy is considered. Other degrees of freedom, such as lattice heat and polymer backbones, are disregarded.

FIG. 23 illustrates entropy as a function of temperature for the cycle depicted in FIG. 22. Only the polarization contribution to free energy is considered. Other possible degrees of freedom that could contribute to entropy changes, such as lattice heat and polymer backbones, are disregarded in the illustration. Where those other factors are negligible, the cycle is isentropic even in the absence of regeneration.

In other embodiments, the present invention that provides for poling without application of an external field can be utilized with any other thermodynamic cycle. The present invention requires only that sufficient charge remain on the electrodes after discharge to provide an electric field that is adequate for poling. In yet another embodiment of the present invention, poling in this manner can be done in a cycle wherein the ferroelectric material does not strictly enter a paraelectric or antiferroelectric phase. Rather, a cycle can be used whereby the ferroelectric material remains in its ferroelectric phase at all times, but is cycled from a greater degree of polarization to a lesser degree of polarization. In one such embodiment, the cycle depicted in FIG. 22 is the same, but $T_H$ is not sufficient to cause the material to become strictly paraelectric or anti-ferroelectric. The minimum $P_L$ in this implementation will be some value greater than zero. Its specific value will depend on the material system and $T_L$, and specifically on how far $T_L$ is from causing a complete transition out of the ferroelectric phase.

Figure 3:
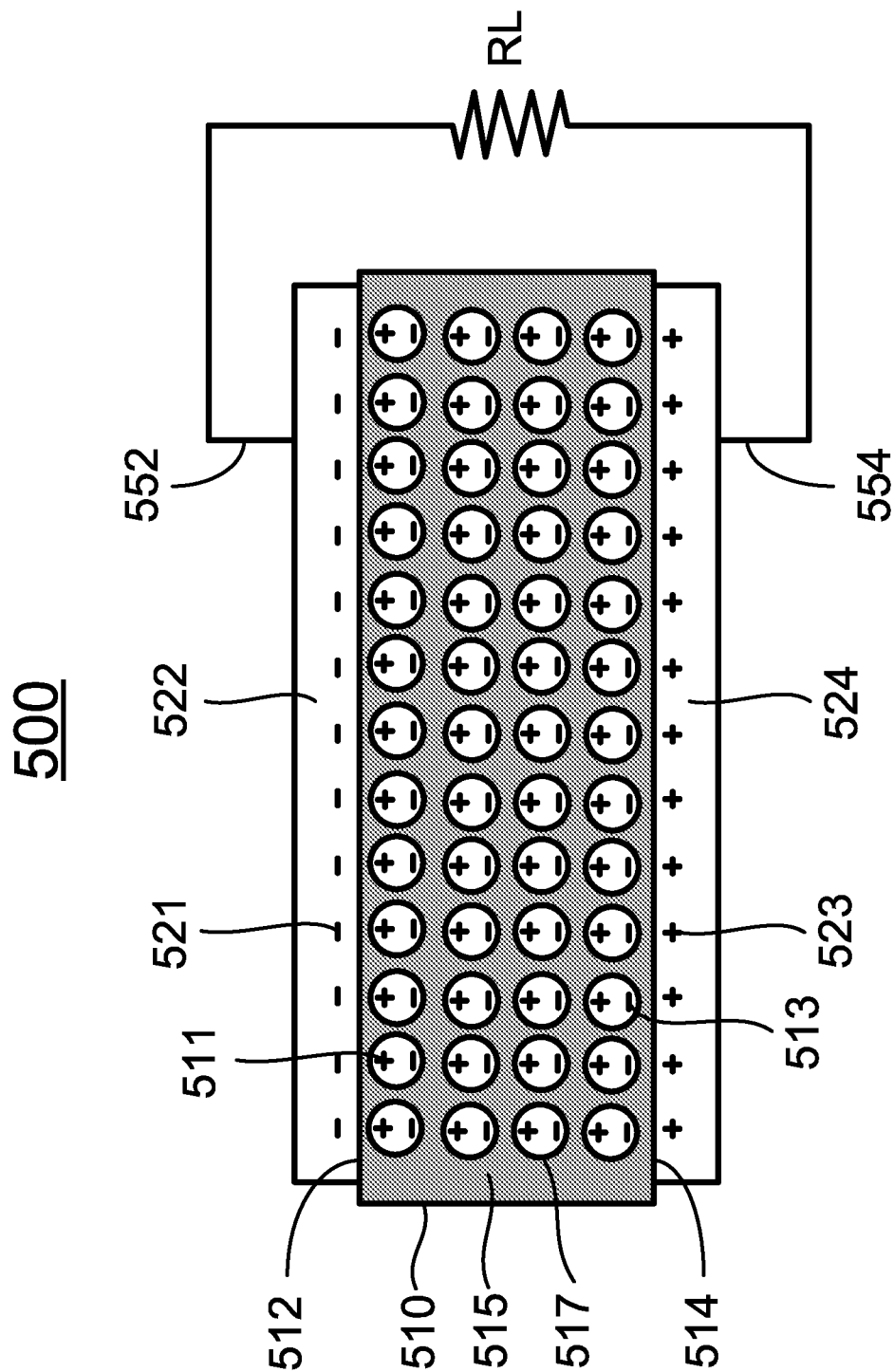
FIG. 3 illustrates schematically bound charges on the surfaces of a ferroelectric structure/layer and the opposing screening charges that are induced on the adjacent surfaces of the electrodes when there is substantial net spontaneous polarization, $P_s$, which may be denoted as $P_r$ in the absence of an external field.

FIG. 3 shows schematically a ferroelectric module 500 in the ferroelectric phase with bound surface charges generated on the surfaces of the ferroelectric layer 510 and corresponding screening charges generated on the electrodes 522 and 524. In the exemplary embodiment, the electric dipoles 517 are aligned, for example, by a small poling field, thereby enabling a large overall net spontaneous polarization to occur in the ferroelectric layer 510. The resulting large net spontaneous polarization produces very dense bound charges 511 and 513 on the surfaces 512 and 514 of the ferroelectric layer 510. As a result, a current flows to the electrodes 522 and 524. Screening charges 521 and 523 are thereby produced on the electrodes 522 and 524 that equal, but are opposite in charge to, the bound charges 511 and 513 at the surfaces 512 and 514 of the ferroelectric layer 510. At that point, the net electric field in the electrodes 522 and 524 is necessarily negligible or zero since the electrodes 522 and 524 are conductors. The bound charges 511 and 513 in the ferroelectric layer 510 result from the aligned electric dipoles 517 and $P_s$, while the screening charges 521 and 523 on the electrodes 522 and 524 result, in turn, from the bound charges 511 and 513, and are in opposition to those bound charges 511 and 513.

As the ferroelectric goes through phase transition and becomes paraelectric or antiferroelectric, the spontaneous polarization in the ferroelectric layer 510 disappears. As a result, the screening charges 521 and 523 on the electrodes 522 and 524 become unscreened at an extremely high potential difference between the electrodes 522 and 524. The exact potential difference will depend upon the particular ferroelectric and the configuration of the module, but potentials in excess of 30,000 volts may be attained with appropriate materials before dielectric breakdown.

Figure 4:
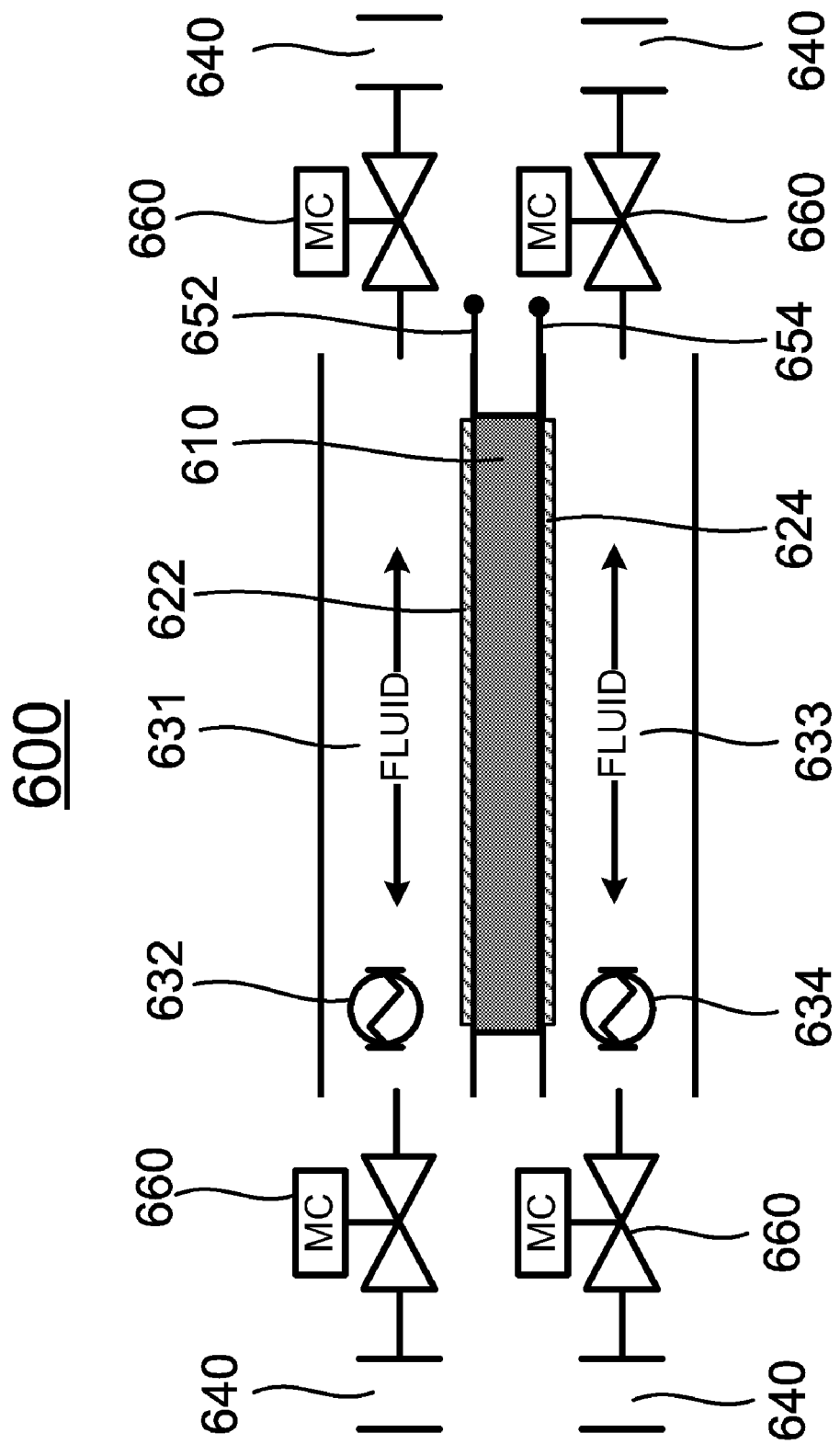
FIG. 4 shows schematically a cross-sectional view of a ferroelectric device for converting heat to electric energy according to another embodiment of the present invention.
Figure 5:
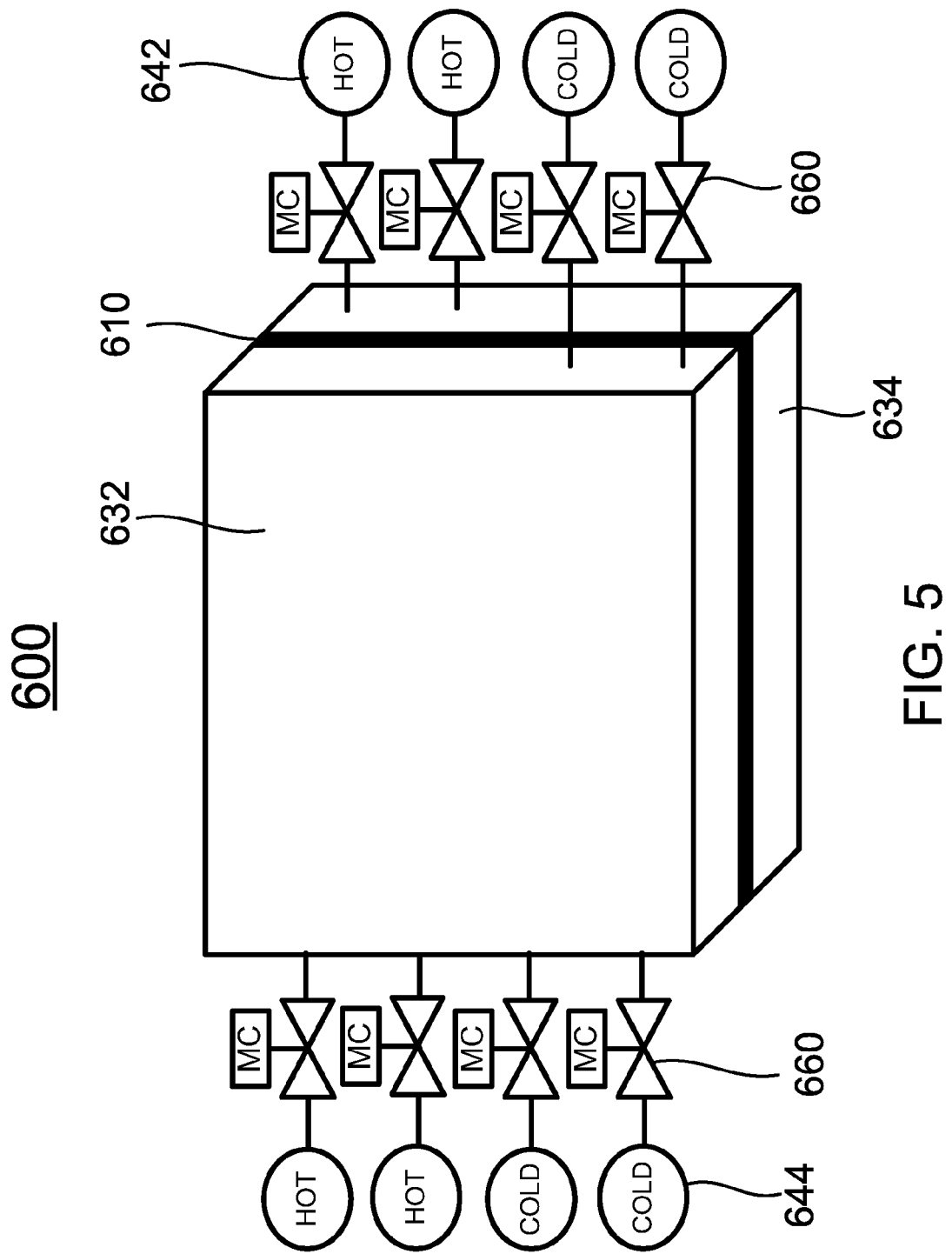
FIG. 5 shows schematically a perspective view of the ferroelectric device as shown in FIG. 4.

FIGS. 4 and 5 show another embodiment of a heat-to-electric conversion device 600 according to the present invention. In the exemplary embodiment, the device 600 has a ferroelectric layer 610, a pair of electrodes 622 and 624 respectively formed on the surfaces of the ferroelectric layer 610, and a delivering means in relation to the pair of electrodes 622 and 624 for alternately delivering a cold fluid and a hot fluid over the surface of the ferroelectric layer so as to alternately cool the ferroelectric layer 610 at a first temperature $T_L < T_c$, and heat the ferroelectric layer 610 at a second temperature $T_H > T_c$; thereby the ferroelectric material of the ferroelectric layer 610 undergoes alternating phase transitions between the ferroelectric phase and the paraelectric or antiferroelectric phase with temperature cycling.

As shown in FIG. 4, the delivering means has a first fluid passage 631 and a second fluid passage 633, a number of heat exchangers 632 and 634 including the first and second fluid passages 631 and 633, and a plurality of control valves 660 in communication with the heat exchangers 632 and 633.

The first fluid passage 631 and the second fluid passage 633 are configured such that when a cold fluid passes through at least one of the first and second fluid passages 631 and 633, the ferroelectric layer 610 is cooled towards the first temperature $T_L$, and when a hot fluid passes through at least one of the first and second fluid passages, the ferroelectric layer is heated towards the second temperature $T_H$. The flow of cold and hot fluids are supplied from a heat sink 644 and a heat source 642, respectively, through, for example, a conduit 640.

The heat exchangers 632 and 634 are adapted for alternately delivering the flow of cold fluid and the hot fluid so as to alternately cool the ferroelectric layer 610 at a first temperature $T_L$, and heat the ferroelectric layer 610 at a second temperature $T_H$. The plurality of control valves 660 is adapted for controlling the flow of cold and hot fluids in order to cycle the ferroelectric modules around their respective transition temperatures. The plurality of control valves 660, controlled by microcontrollers, are connected to thermocouples in the heating and cooling fluids and attached to the ferroelectric, and the temperature and other data such as the capacitance of the ferroelectric may be used to control the opening and closing of the control valves 660. The pressure in the hot and cold fluids may also be monitored at one or more locations, respectively. The cooling and heating of the ferroelectric is coordinated with the opening and closing of the electrical circuit, all under the direction of a control circuit that is subject to computer control, to achieve the cycle depicted in FIG. 22 and described herein. Electrical and thermal cycling are coordinated by directly monitoring, among other things, the temperature of the ferroelectric with devices such as thermocouples or thyristors; the temperature of the heating and cooling fluids; the capacitance of the ferroelectric system, capacitance being correlated to the temperature of the ferroelectric layer as a whole; the polarization of the ferroelectric layer; and/or the pressure of the hot and cold fluids, particularly in two-phase heat exchanger configurations. The extent of unbound charges on the electrodes 622 and 624 may also be monitored and may be used in controlling the cycle and, among other things, determining when the field resulting from that charge remains sufficient to pole the dipoles during the transition of the ferroelectric layer 110 into its ferroelectric phase.

Figure 6:
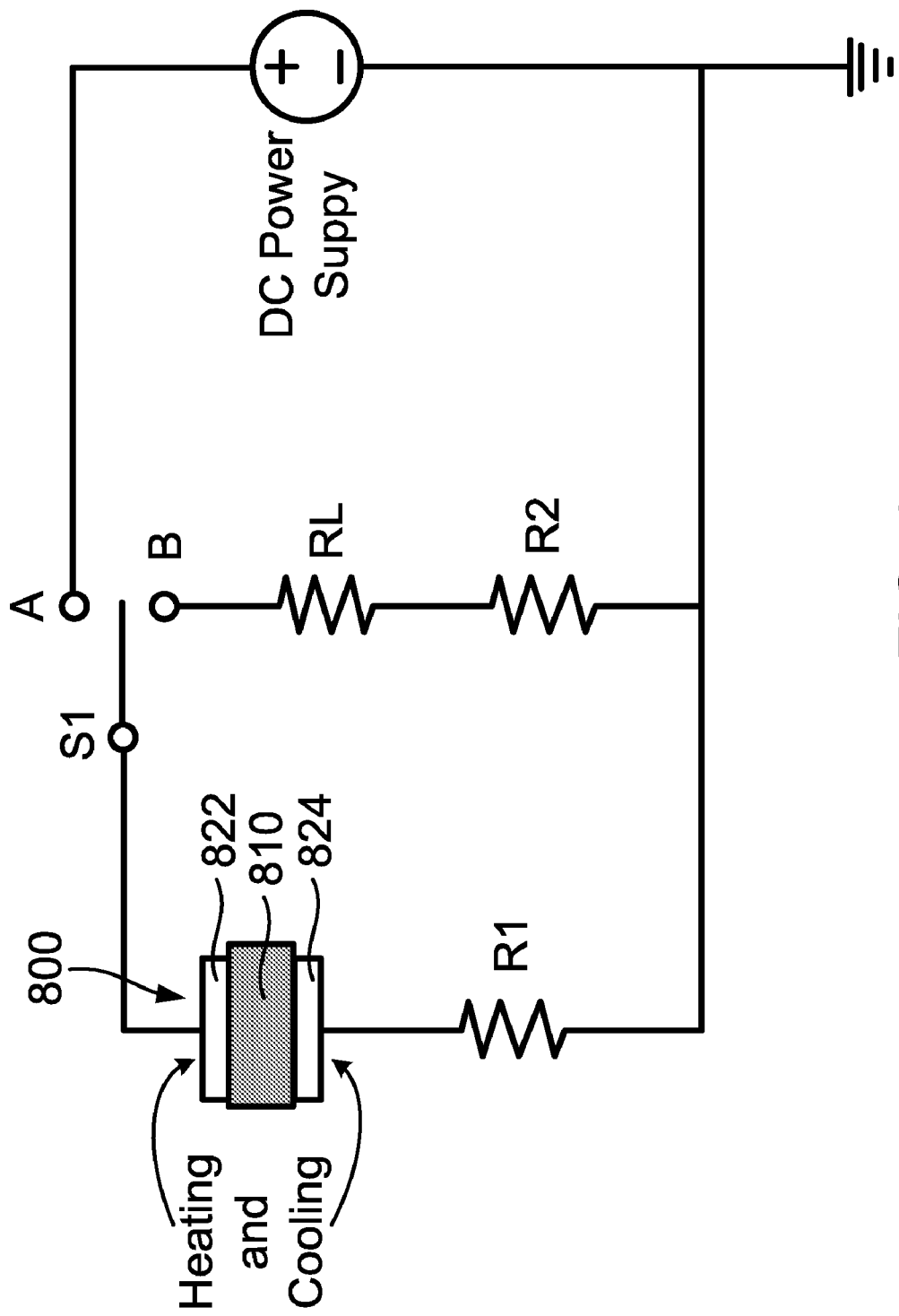
FIG. 6 shows schematically a ferroelectric power generator for operation with a resistive load according to one embodiment of the present invention.

FIG. 6 illustrates schematically a heat-to-electric energy conversion device 800 connected to a DC power supply that may be used for poling if necessary, and to an external load resistance, RL, for receiving the electrical discharge generated, according to one embodiment of the present invention. According to one embodiment, one or more monitoring devices (not shown) are attached to or embedded in the ferroelectric device to monitor the temperature of the ferroelectric material. Such monitoring may be done, for example, by one or more thermocouples or thyristors or by monitoring the capacitance of the device. Additionally, resistors R1 and R2 which may remain in the circuit to monitor the current, as they have negligible resistance compared to the load resistance RL. Polarization may be monitored by integrating the current flow through resistors R1 and/or R2. Throughout the cycle, the ferroelectric module 800 undergoes actions controlled by one or more computers acting through a control circuit, which are not shown, that control heating and cooling and control the switch S1.

In practice, the cycling of the ferroelectric modules 600 and 800 are repetitive and ongoing so long as the device is to be used to generate electricity from heat. Thus, a description of a cycle could begin at any point in the cycle. For the purpose of illustrating the operation of the device in one embodiment, the ferroelectric module 600 or 800 is initially assumed to be at point C of the cycle depicted in FIG. 22. At that point, switch S1 is opened and the ferroelectric layer 810 is at $T_H$ and polarization is at $P_L$. As described elsewhere the value of $P_L$ corresponds to a residual unbound charge that creates a field sufficient for poling the electric dipoles that arise spontaneously when the ferroelectric layer 810 transitions to the ferroelectric phase. While the switch S1 remains open, the ferroelectric layer 810 is cooled to $T_L$ by the withdrawal of heat, bringing the cycle to point D in FIG. 22. Keeping the switch S1 open prevents the flow of charge to or from the electrodes 822 and 824, such that polarization remains at $P_L$ during that step of the cycle.

At point D of the cycle in the usual operation of the invention after the first cycle, switch S1 is switched to position B as shown on FIG. 6, which closes the circuit between the electrodes 822 and 824 and the load resistance, RL. While the switch S1 is in position B, heat is withdrawn from the ferroelectric layer 810 isothermally at $T_L$, corresponding to step DA of the cycle depicted in FIG. 22. In step DA, the polarization retains its direction but grows in magnitude to the value $P_H$. The resulting overall spontaneous polarization, $P_s$, produces very large bound charges on the surfaces of the ferroelectric layer 810. Those bound charges cause screening charges to develop on electrodes 822 and 824 that are equal and opposite to the bound charges at the surfaces of the ferroelectric layer 810. Heat $Q_L$ withdrawn during the DA step of the cycle corresponds to the enthalpy of phase transition. At point A, spontaneous polarization in the ferroelectric layer 810 is at the maximum, $P_H$, and the net electric field in the electrodes is negligible since the electrodes now carry sufficient charges to balance the bound charges due to $P_H$. Large amounts of electrical energy are generated spontaneously during step DA corresponding to the free energy difference between points D and A in FIG. 21. FIG. 3 illustrates (1) the bound charges in the ferroelectric that are the result of the aligned electric dipoles and $P_s$ and (2) the screening charges that arise on the electrodes in opposition to those bound charges, as would occur at point A of the cycle (though at point A the load resistance RL would not be in the circuit as it is depicted in FIG. 3).

In one embodiment, a DC voltage source is included in the circuit when the switch S1 is in position A, and that voltage source can be used for poling in the first cycle or for any reason if during operation the field from the residual charges on the electrodes 822 and 824 at point D of the cycle becomes insufficient to pole the ferroelectric layer 810. In that event, switch S1 is switched to position A at point D of the cycle and a DC voltage is applied across the ferroelectric layer to pole the dipoles that spontaneously arise during transition. The voltage required for poling is material dependent, but is small compared to the voltage at which the charge is discharged from the ferroelectric device 800. Other than the minimum required for poling in such instances, a voltage need not be applied across the ferroelectric layer 810 and is discontinued. When polarization reaches $P_H$, the switch S1 is opened to the mid-position illustrated in FIG. 6, and the device is at point A in the cycle of FIG. 22.

The field that is sufficient for poling depends upon the particular material, its geometry, whether the device is operated in a single- or multi-stage configuration, and other factors. The minimum poling field generally will be of the same strength whether it is created by the residual charges on electrodes 822 and 824 at points C and D of the cycle, or whether it is imposed from an external DC voltage source. By way of an example, for some single stage, lead-based ceramic ferroelectrics of approximately 1.0 mm thickness, an adequate poling field may be achieved by a voltage of approximately 200 volts. By contrast, the generated voltage can exceed 6,000 volts during electrical power output. Without poling, the unit cells would spontaneously exhibit electric dipoles when the material is in the ferroelectric phase but, in the overall aggregate, the dipoles would not be aligned. Such alignment is essential to achieve the high overall $P_s$ values that are exploited by the invention.

During the AB step of the cycle depicted in FIG. 22, the switch S1 is open, and the ferroelectric layer 810 is heated to T. so that it transitions out of the ferroelectric phase. Because the switch is open, the unbound charges on the electrodes are prevented from discharging during the lattice heating that occurs during the AB step, which in turn causes total polarization to remain at $P_H$.

At point B of the cycle, switch S1 is switched to position B and heat is added to the ferroelectric layer 810 isothermally at $T_H$ so that large amounts of electrical energy are released to the load RL from the ferroelectric module 800. As the electrical charges are removed from the electrodes 822 and 824, the charges are received at a very high voltage by the load resistor, RL, or by any other suitable device that can be used to store, transmit, or utilize electricity for work. When the free charges remaining on the electrodes 822 and 824 have diminished to the minimum that is sufficient to establish a field to pole the spontaneous dipoles during the transition back to the ferroelectric state, the withdrawal of electrical energy from the electrodes is stopped by opening the switch S1, which corresponds to point C of the cycle. Total polarization at that point is $P_L$, and the ferroelectric layer 810 is at $T_H$.

In one embodiment, a full-wave rectifier (not shown) is included in the circuit when the switch S1 is in position B. The rectifier causes current flows to and from the electrodes 822 and 824 to have the same direction at the load RL whether the current occurs during the BC or DA steps of the cycle. Such a full-wave rectifier may consist, for example, of a bridge circuit. Rectifying the signal in this fashion may simplify the subsequent use or storage of the electrical energy generated during cycling and will generally increase the total energy available for external use.

In another embodiment, the ferroelectric material is not cycled pursuant to the thermodynamic cycle set forth in FIG. 22 and as otherwise described herein. Rather, the ferroelectric module may be cycled using any thermodynamic cycle that allows the ferroelectric material to be cycled from a ferroelectric state in which the spontaneous dipoles are poled, to a paraelectric or antiferroelectric state wherein polarization is maintained so that it does not decrease below a minimum level, $P_L$, where $P_L$ corresponds to a level of polarization that produces a field sufficient to pole during the transition to the ferroelectric phase.

Figure 24:
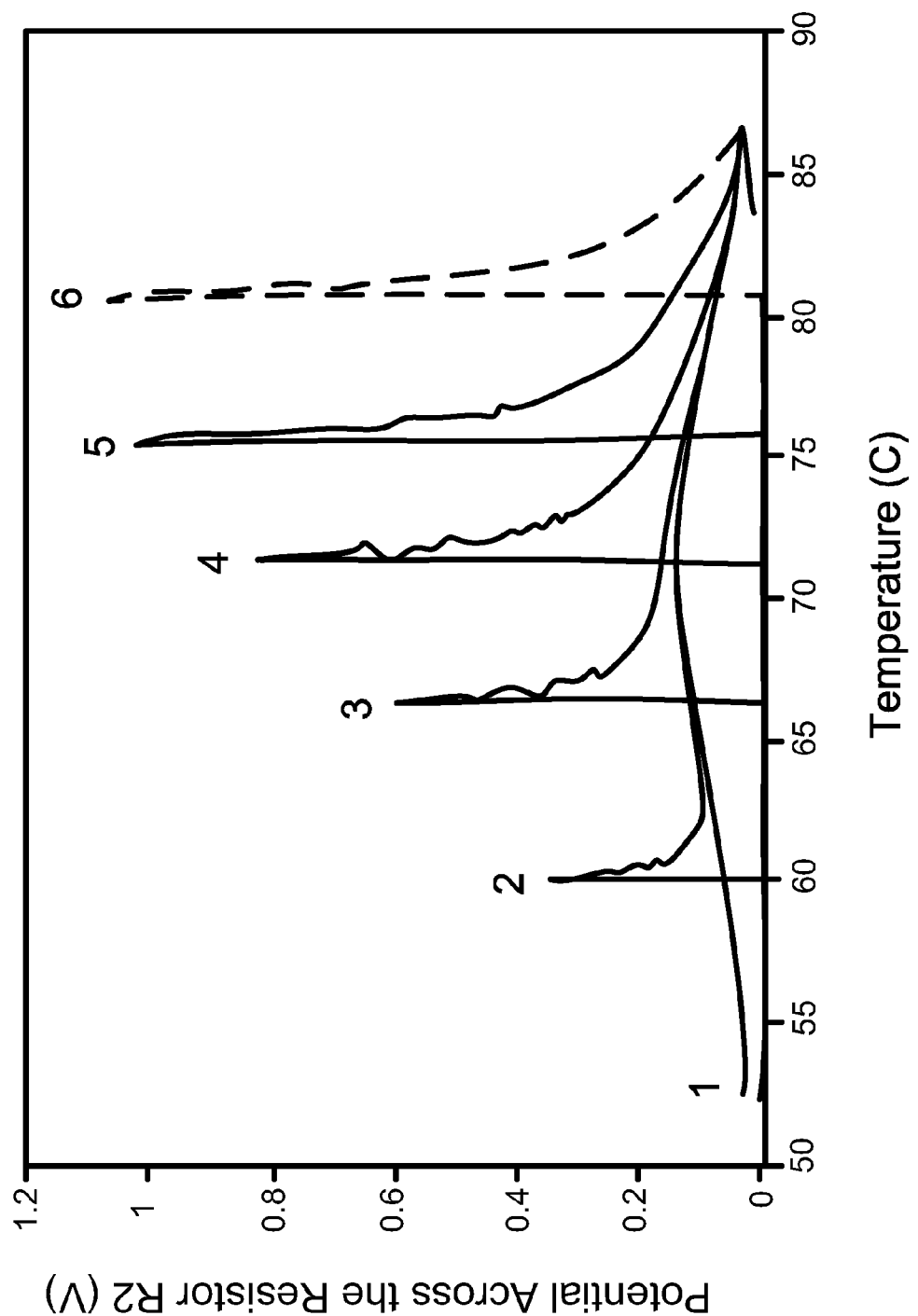
FIG. 24 shows the measured electric current generation during the heating phases, resulting from changes in the permanent polarization that correspond to different relay turn-on temperatures for a P(VDF-TrFE) copolymer film of 50 µm thickness.

FIG. 24 shows the measured electric current generated during the heating phases, resulting from the change in permanent polarization that correspond to different relay turn-on temperatures for a P(VDF-TrFE) copolymer film of 50 μm thickness. The load resistor RL had a resistance of 10 MΩ, and the measure resistors R1 and R2 were chosen at 0 and 22 kΩ, respectively. The horizontal axis has been largely expanded due to the somewhat broad transition of the copolymer, which makes the original peak (line 1) look flat. Lines 2-6 in FIG. 24 show the electricity generated with increasing delay temperature (time). These lines correspond to the AB step in the thermodynamic cycle shown in FIG. 22. The electric potential (field) generated across the sample dramatically increases with larger delay temperatures, reaching about 10 times the potential attained with the original peak of line 1. The increasing potential with larger delay temperature corresponds to the enlargement of the rectangular cycle along the temperature axis at constant polarization (AB step). Thermodynamically, this leads to a larger efficiency. The integrated intensities remain largely constant, as expected.

The thermal cycling and the electrical inputs and outputs are computer controlled throughout the cycle. Heating and cooling during the various steps of the cycle are accomplished by microcontrollers causing hot and cold fluids, to be alternately directed to the ferroelectric module 800. Different controls, as may be appropriate to a particular application and to a particular heating and cooling system, can be attained by using microcontrollers in combination with computers and a control circuit. The control valves that regulate the flow of heating and cooling fluids to the ferroelectrics in one embodiment are illustrated in FIGS. 4 and 5. The computer controls receive temperature values from thermocouples or other devices that monitor the temperature in the heating and cooling fluids and in the ferroelectric materials. Pressures in the hot and cold fluid fluids may also be monitored. The computer controls also monitor polarization and load currents as measured, for example, by resistors R1 and R2, as shown in FIG. 6. Polarization may be monitored by integrating the current flow through resistors R1 and/or R2. Computers and a control circuit control the heat exchangers to cause appropriate thermal cycling of the ferroelectric module. Microcontrollers that receive such monitoring data under computer control also direct the position of the switch S1. Instead of or in addition to thermocouples or thyristors, capacitance or other measurements of one or more control ferroelectrics may be used as monitors and to control the timing of the cycling and switching with the control circuit.

Referring to FIG. 7, a method 900 for operating the invented device for converting heat to electrical energy is shown according to one embodiment of the present invention. In one embodiment, the method 900 includes the following steps: at step 910, a ferroelectric layer is provided. The ferroelectric layer is comprised of a ferroelectric material characterized with a Curie temperature, $T_c$. A pair of electrodes is positioned respectively on the first surface and the second surface of the ferroelectric layer, with electrical leads going from the electrodes to external circuitry. The electrodes are comprised of a thermally and electrically conductive material.

At step 920, a cold fluid and a hot fluid are alternately delivered so as to alternately cool the ferroelectric layer to a first temperature $T_L$ that is lower than the Curie temperature $T_c$, and heat the ferroelectric layer to a second temperature $T_H$ that is higher than the Curie temperature $T_c$. During step 920, the electrical circuit is opened so that cooling and heating occur under effectively constant polarization while lattice cooling and heating occur. The cold fluid and the hot fluid can alternately be delivered by heat exchangers, control valves, or the likes, controlled in coordination with data monitors and under direction from a control circuit.

At step 930, a cold fluid and a hot fluid are alternately delivered so as to alternately remove heat from the ferroelectric layer isothermally at a first temperature $T_L$ that is lower than the Curie temperature $T_c$, and add heat to the ferroelectric layer isothermally at a second temperature $T_H$ that is higher than the Curie temperature $T_c$. During step 930, the electrical circuit is closed so that the removal of heat occurs as polarization changes from $P_L$ to $P_H$, and the addition of heat occurs as polarization changes from $P_H$ to $P_L$. A cold fluid and a hot fluid can alternately be delivered by heat exchangers, control valves, or the likes, controlled in coordination with data monitors and under direction from a control circuit.

At step 940, with the ferroelectric material initially in a metastable state, the spontaneous polarization of the domains in the ferroelectric material is poled at temperature $T_L$ so as to generate electrically-opposite screening charges on the pair of electrodes. The poling field is provided by residual charges on the electrodes that are on the surfaces of the ferroelectric layer, which residual charges are not withdrawn during the discharge step of the cycle. The residual charges remaining are that which are sufficient to create a poling field as the ferroelectric layer transitions back into its ferroelectric phase. In another embodiment, the poling is performed when necessary by applying a small external field to the ferroelectric layer.

At step 950, heat is added to the ferroelectric layer isothermally at $T_H$, and the circuit is closed. Electricity corresponding to the generated electrically-opposite screening charges on the pair of electrodes is output to an external circuitry at a very high voltage. All of the electrically opposite screened charges on the pair of electrodes are not discharged. The circuit is opened to allow a sufficient residual charge remaining on the electrodes to provide a field for poling.

It should be noted that, while the essential function of the device occurs in a single layer with a given ferroelectric material, the invention generally may be more useful in practical applications and may produce greater quantities of electrical energy from a particular heat source where a number of ferroelectric materials are combined in a series of stages. In some applications where the temperature difference between the heat source and the heat sink is small, a single layer may be appropriate. While that situation allows a less robust opportunity for converting heat to electricity, that is an unavoidable consequence of thermodynamics, which dictates that the maximum efficiency of any system that converts thermal energy to another form of energy or work is the Carnot efficiency, $\eta_c = \Delta T/T_H$. In applications where $\Delta T$ is larger, it may be desirable to utilize a multistage conversion module that includes a series of ferroelectric materials with a succession of phase transition temperatures that correspond to the available temperatures between $T_H$ and $T_L$. The magnitude of $\Delta T$ that warrants multi-stage treatment will vary depending upon the specific application and materials system used. There may be applications where it is appropriate to operate a single device over a relatively large $\Delta T$, for example 100° C. or more, and that may be the case in particular in conjunction with heat regeneration techniques.

There are a number of configurations or embodiments whereby the basic principle of the present invention can be used in a multistage format with multiple ferroelectrics that have multiple phase transition temperatures, several of which embodiments will be described here. By providing these descriptions, it is not the intention to limit the invention to these configurations, which are merely illustrative. Also, where these descriptions and embodiments refer to Curie temperatures, $T_c$, it should be understood that the descriptions are equally applicable for ferroelectrics where the ferroelectric phase exists at temperatures above the transition temperature and the material is paraelectric below that transition temperature; for ferroelectrics where the transition is between ferroelectric and antiferroelectric phases; and for polarizable polymers.

FIG. 8 shows an apparatus 1000 having a plurality of ferroelectric modules, FM1, FM2, ... FMn−1 and FMn, arranged in an array to expand the working surface that interfaces with the heat exchangers so as to increase the amount of thermal energy that can be received from the heat source and be converted to electrical energy. The electrical output is removed by buses 1001 connected to the electrodes of each module.

Figure 9:
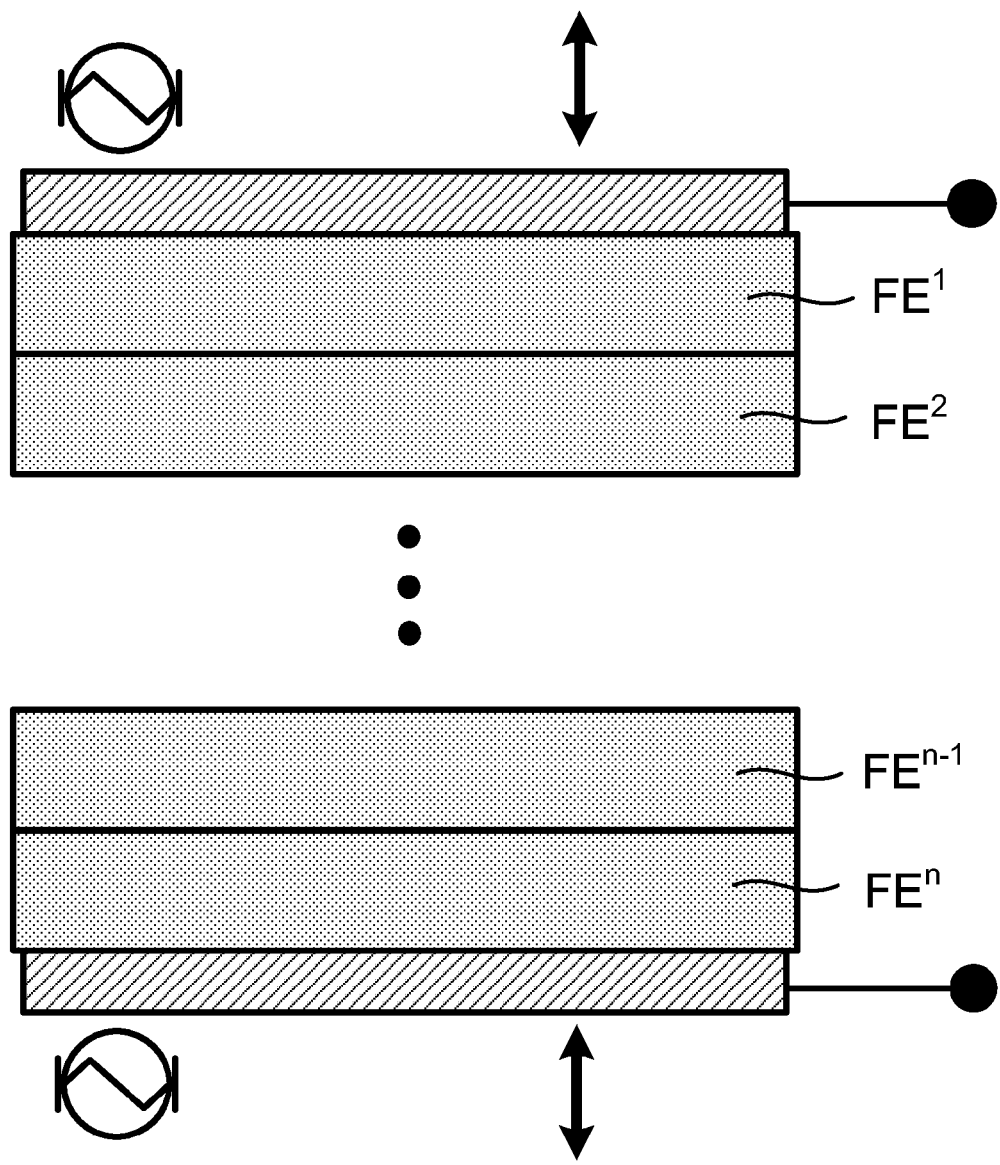
FIG. 9 shows schematically a ferroelectric device for converting heat to electric energy according to another embodiment of the present invention.
Figure 10:
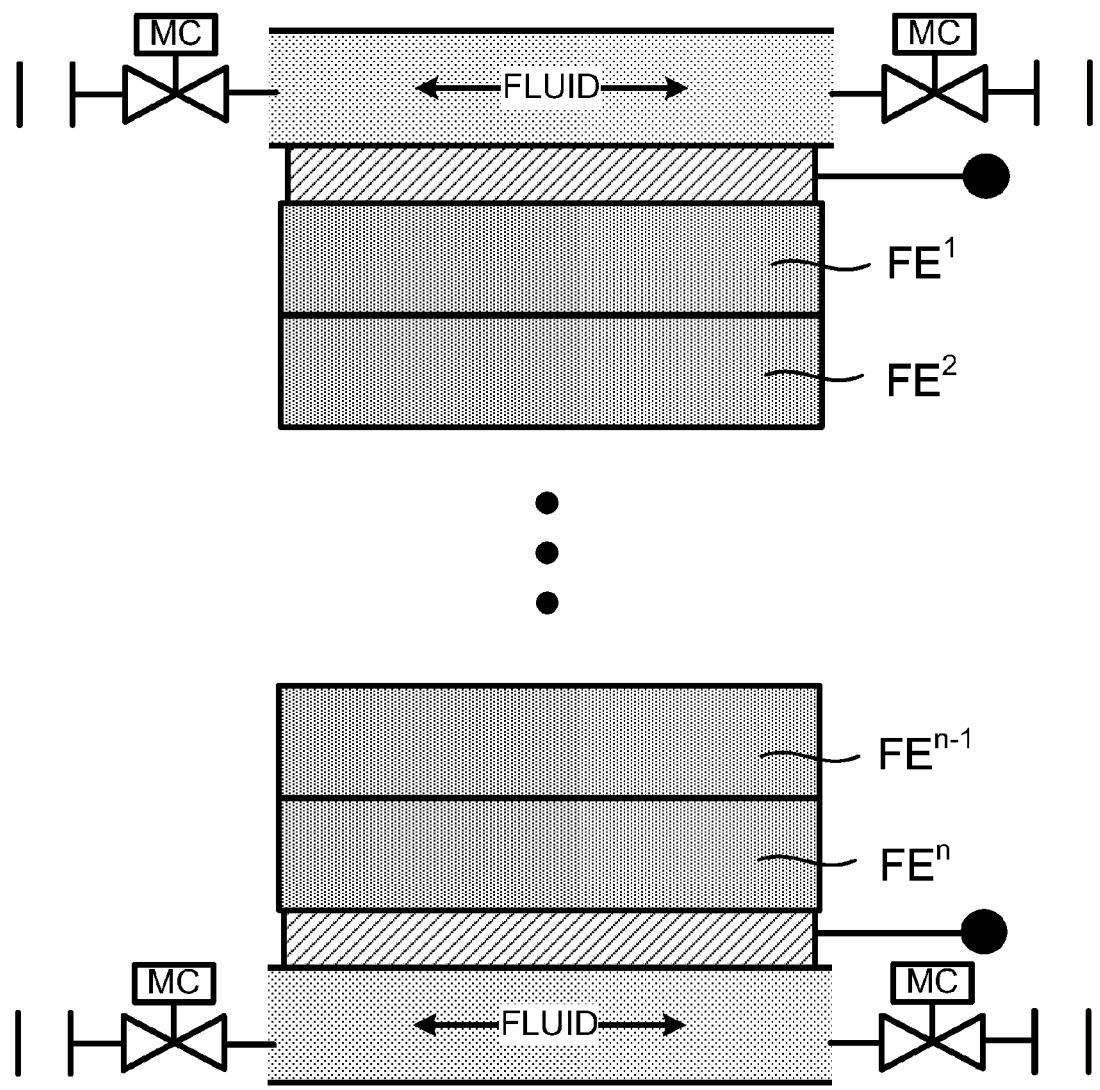
FIG. 10 shows schematically a ferroelectric device for converting heat to electric energy according to yet another embodiment of the present invention.

In a multilayer configuration, a series of ferroelectric layers may be arranged in a stack formed in order to maximize thermal conductivity. The resulting multilayered ferroelectric structure is placed between a pair of electrodes, which is similar to the single layer device as disclosed above. Such a configuration is illustrated diagrammatically by FIGS. 9 and 10. The sequential layers, $FE^1$, $FE^2$ ... $FE^{n-1}$ and $FE^n$, are formed of an identical ferroelectric material or substantially different ferroelectric materials. The Curie temperatures, $T_c^1$, $T_c^2$ ... $T_c^{n-1}$ and $T_c^n$, correspond to the ferroelectric materials in the sequential layers $FE^1$, $FE^2$ ... $FE^{n-1}$ and $FE^n$. In one embodiment, the multilayered ferroelectric materials are arrayed so that $T_c^{i+1} > T_c^i$. In one embodiment, the combined multilayer module is then cycled thermally and electrically so that each individual layer cycles around its phase transition temperature with poling and discharge as described herein for a single layer device. With this multilayer configuration, as shown in FIGS. 9 and 10, the electrical energy removed at high voltage during the discharge step of the cycle is related to the total spontaneous polarization, $P_s$, at the junctures of the electrodes and the ferroelectric materials designated as $FE^1$ and $FE^n$, which polarization results from the cumulative spontaneous polarization of each FE layer acting together.

Figure 11:
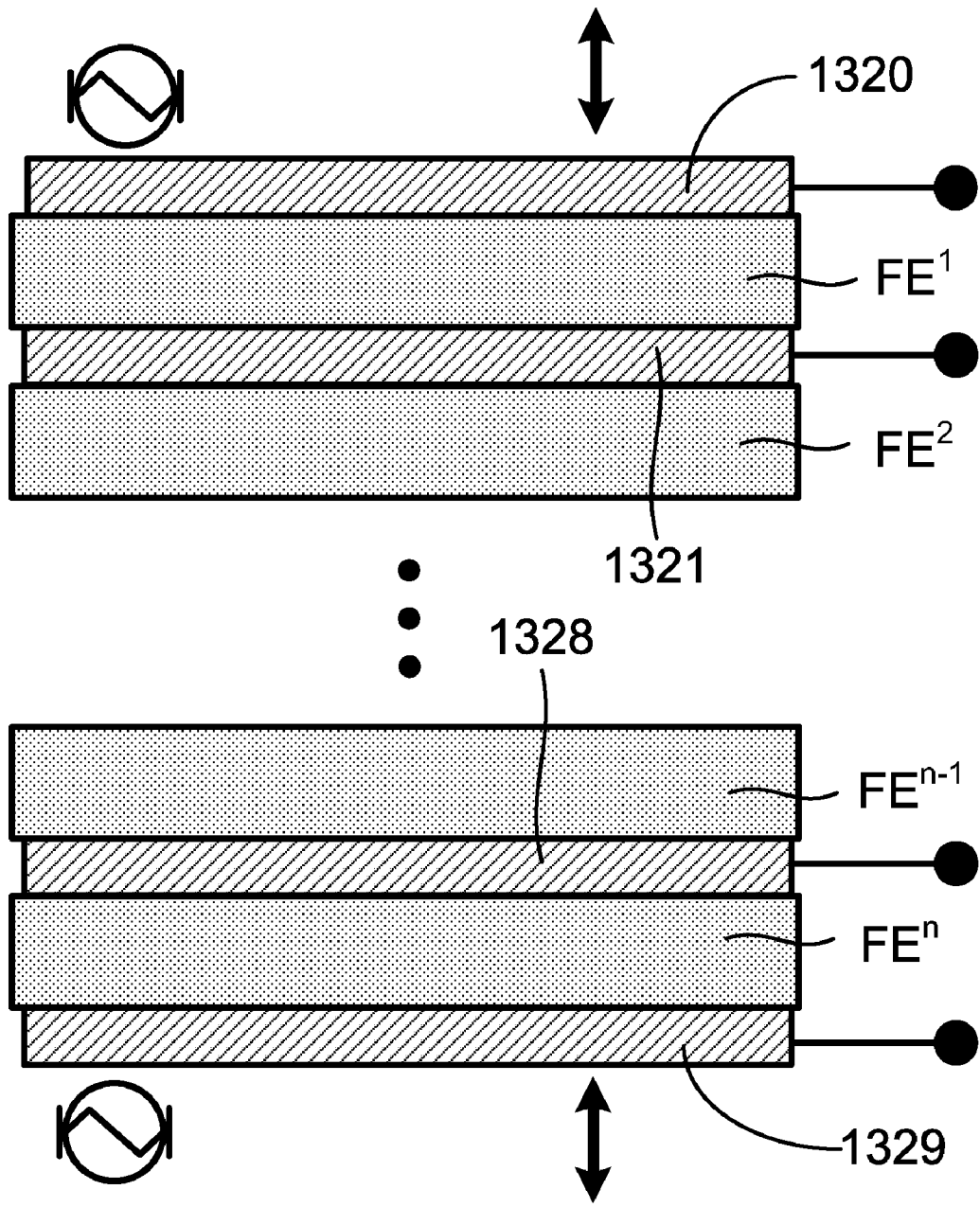
FIG. 11 shows schematically a ferroelectric device for converting heat to electric energy according to an alternative embodiment of the present invention.

Referring to FIG. 11, another embodiment of a multilayered ferroelectric device 1300 is shown according to the present invention. This configuration of the multilayered ferroelectric device 1300 is similar to the device as disclosed in FIG. 9, but separate electrodes are placed between each ferroelectric layer. For example, the ferroelectric layers $FE^1$ and $FE^2$ are separated by the electrode 1321, while the ferroelectric layers $FE^{n-1}$ and $FE^n$ are separated by the electrode 1328. These electrodes 1320, 1321 ... 1328 and 1329 are formed of a thermally and electrically conductive material. The thermal and electrical cycling and operation of the device 1300 are similar to the device as disclosed in FIGS. 9 and 10. However, the extraction of the electrical energy from the device is different. In this configuration, electrical energy is withdrawn during the cycle from all of the electrodes 1320, 1321 ... 1328 and 1329, as shown in FIG. 11. The electrical energy withdrawn from the electrodes 1320, 1321 ... 1328 and 1329 can then either be transported via the connective leads to a load resistance or to a bus for exportation to such external circuitry and use as may be desired.

Figure 12:
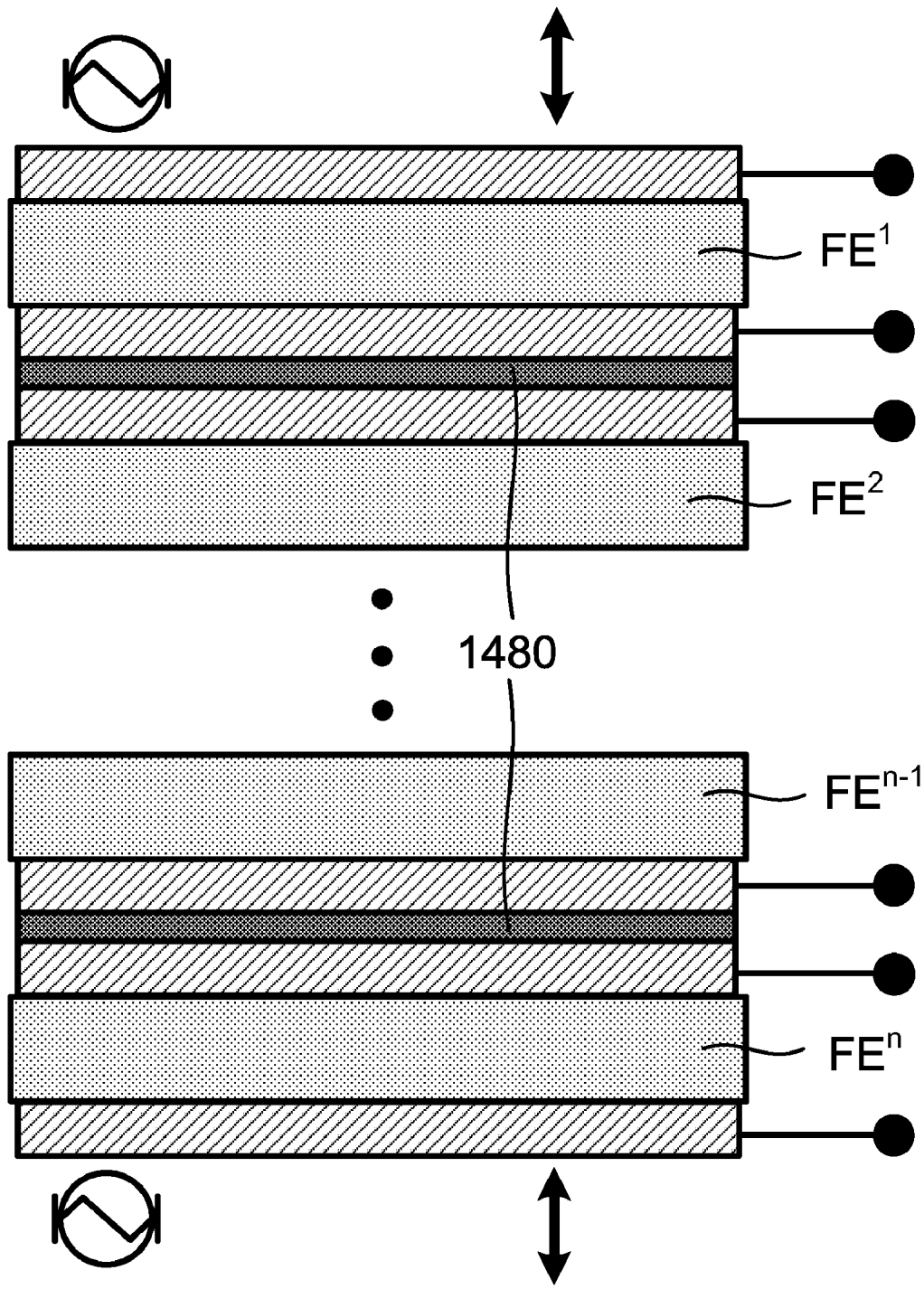
FIG. 12 shows schematically a ferroelectric device for converting heat to electric energy according to a further embodiment of the present invention.

FIG. 12 shows schematically an alternative embodiment of a multilayered ferroelectric device 1400. This configuration of the multilayered ferroelectric device 1400 is similar to the device as disclosed in FIG. 11, but each ferroelectric layer is separated from the adjacent layer of ferroelectric material by two electrodes which, in turn, are separated by an electrical insulator 1480, which is selected to minimally impede thermal transfer.

Figure 13:
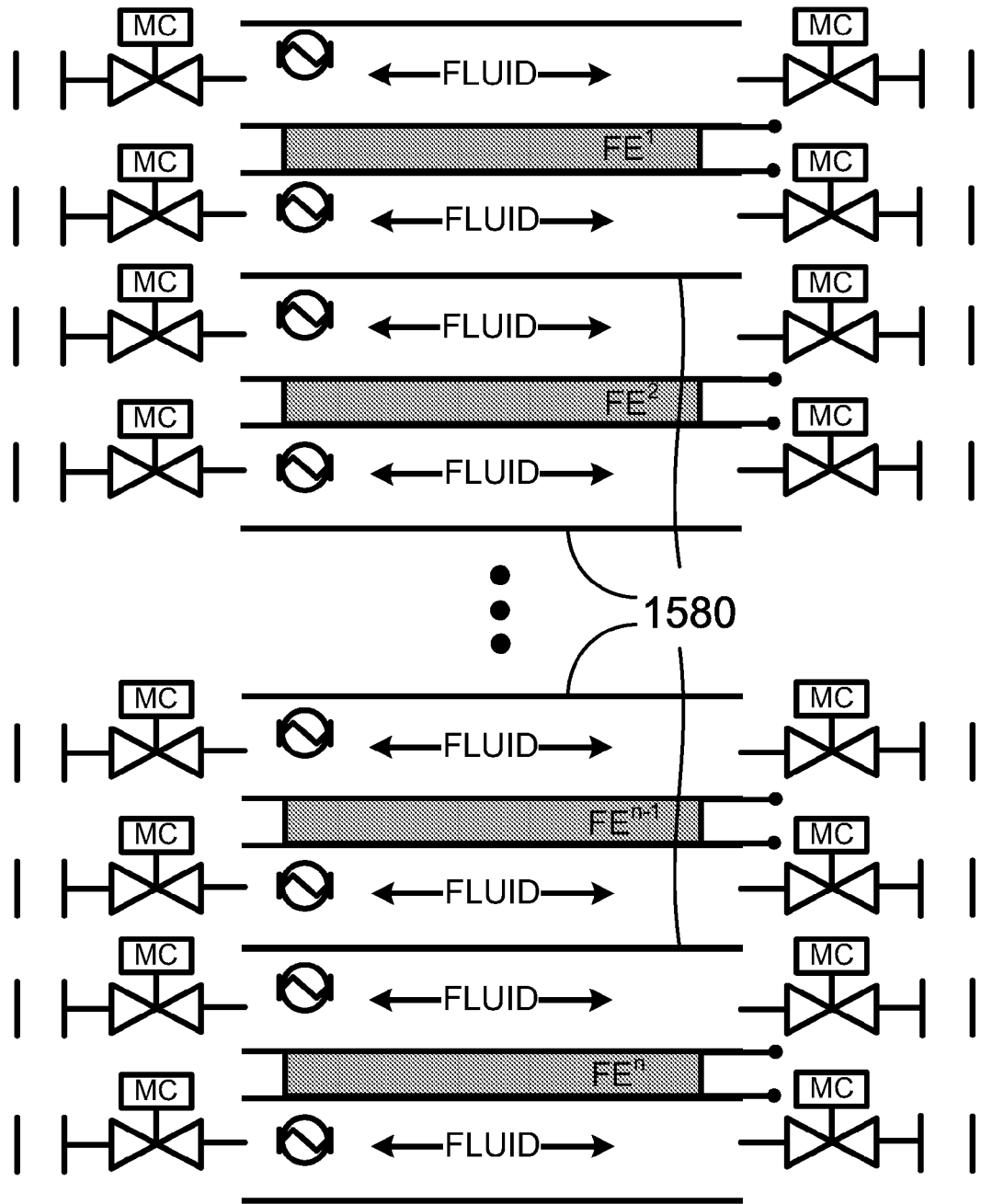
FIG. 13 shows schematically a ferroelectric device for converting heat to electric energy according to yet a further embodiment of the present invention.

FIG. 13 illustrates schematically a system of n individual ferroelectric modules with a series of different phase transition temperatures, $T_c^1$ to $T_c^n$, that lie in an increasing (or decreasing) sequence between the temperatures of the heat source, $T_H$, and the heat sink, $T_L$, and that are operated with a heat exchanger system so as to cycle each ferroelectric stage, $FE^i$, around its respective phase transition temperature, $T_c^i$. In this configuration, the phase transition temperatures vary among different ferroelectric layers $FE^1$, $FE^2$ ... $FE^{n-1}$ and $FE^n$. As shown in FIG. 13, a series of single-layer devices as shown in FIG. 4 are arranged in a stack. Each single-layer device operates with heat exchangers that selectively heat and cool the individual ferroelectric modules so that the i-th layer is thermally cycled around its respective phase transition temperature, $T_c^i$. In this configuration, the ferroelectric modules are integrated with a networked heat exchanger that cycles each ferroelectric module, $FM^i$, around its transition temperature, $T_c^i$. The heat exchangers may be interconnected to facilitate regenerative heating and cooling or to facilitate operating the ferroelectric modules in cascade with decreasing temperature. Adjacent heat exchangers may be thermally insulated from one another by thermal insulators 1580, as shown in FIG. 13. In this system, thermocouples are located such that the temperature of the heating and cooling fluids is monitored throughout the system, as are the temperatures or capacitance of the ferroelectrics in the individual modules. A system of microcontrollers acting in a control circuit then directs the heating and cooling fluids at appropriate temperatures to cause each ferroelectric stage, $FE^i$, to cycle around its respective phase transition temperature, $T_c^i$, in the format and method of poling and thermal and electrical cycling described herein for a single-stage device. In one embodiment, each cycle of the various ferroelectric stages, $FE^i$, undergoes coordinated thermal and electrical cycling as described herein for a single stage with two isothermal steps and two steps where total polarization in the layer is maintained constant. The electrical energy withdrawn from the electrodes can be either transported via the connective leads to a load resistance or to a bus for exportation to such external circuitry and use as may be desired.

In sum, the present invention, among other things, discloses apparatuses and methods for converting heat to electricity by using one or more ferroelectric or other polarizable materials that exhibit changes in spontaneous polarization with temperature change. The ferroelectric or other polarizable material is cycled between temperatures above and below the phase transition temperature to utilize the change in spontaneous polarization. During one step of the cycle, a poling field is applied so that the resulting dipoles are biased in one orientation—i.e., they become poled. That poling field results from a residual charge that remains on the electrodes on the surfaces of the ferroelectric after discharge. By controlling the cycling of the ferroelectric in this fashion, the amount of electrical energy discharged during each cycle is enhanced in comparison to other cycling methods. While the device may be used with a single such ferroelectric material, more robust conversion of heat to electricity may be achieved in some applications by using a series of ferroelectrics that have a succession of phase transition temperatures that vary across the range of temperatures between the temperatures of the heat source and heat sink for the application. Electrocaloric cooling may be achieved by reversing the process.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An apparatus for converting heat to electric energy, comprising:
    (a) a first electrode formed of a thermally and electrically conductive material;
    (b) a second electrode formed of a thermally and electrically conductive material, wherein the second electrode is spaced from the first electrode;
    (c) one or more layers of electrically polarizable material between the first and second electrodes;
    (d) one or more heat exchangers for removing thermal energy from or adding thermal energy to the one or more layers of electrically polarizable material;
    (e) a control circuit, the control circuit:
        thermally cycling the one or more layers of electrically polarizable material between a first temperature $T_1$ and a second temperature $T_2$ by alternately adding thermal energy to and withdrawing thermal energy from the one or more layers of electrically polarizable material using the one or more heat exchangers, wherein the electrically polarizable material exhibits spontaneous polarization at $T_1$ and wherein the spontaneous polarization exhibited by the electrically polarizable material at $T_2$ is less than the spontaneous polarization exhibited by the electrically polarizable material at $T_1$;
        wherein a DC poling voltage is applied to the one or more layers of electrically polarizable material such that, when the material is in a first portion of the cycle which includes the temperature $T_1$, the electrically polarizable material develops an overall net spontaneous polarization and screening charges are generated on the first and second electrodes; and
        wherein the first and second electrodes are connected to a load such that electrical energy is output from the first and second electrodes to the load when the electrically polarizable material is in a second portion of the cycle which includes the temperature $T_2$; and
        wherein residual charges are left on the first and second electrodes after electrical energy is output to the load and wherein the residual charges provide the DC poling voltage for the next cycle.

2. The apparatus of claim 1, wherein the residual charges left on the first and second electrodes after electrical energy is output to the load are such that the resulting polarization exceeds the polarization at the local free energy maximum that occurs when thermally cycling the electrically polarizable material from the temperature $T_1$ to the temperature $T_2$.

3. The apparatus of claim 1, wherein the control circuit further comprises a full-wave rectifier connected in a circuit with the first and second electrodes and the load.

4. The apparatus of claim 3, wherein the first and second electrodes remain connected to the load when thermally cycling after the initial cycle.

5. The apparatus of claim 1, the control circuit:
    connecting the first and second electrodes to the load during the second portion of each cycle; and
    applying the DC poling voltage to the one or more layers of electrically polarizable material during the first portion of each cycle.

6. The apparatus of claim 5, the control circuit switching the first and second electrodes between the DC poling voltage and the load during each cycle such that the first and second electrodes are connected to either the DC poling voltage or the load during each cycle.

7. The apparatus of claim 1, wherein $T_2$ is higher than $T_1$.

8. The apparatus of claim 1, wherein $T_1$ is higher than $T_2$.

9. The apparatus of claim 1, wherein each of the one or more layers of electrically polarizable material has a phase transition temperature at which the material transitions between a phase in which the material exhibits spontaneous polarization and a phase in which the material does not exhibit spontaneous polarization.

10. The apparatus of claim 9, wherein the electrically polarizable material is in the phase which exhibits spontaneous polarization at the temperature $T_1$ and $T_2$.

11. The apparatus of claim 9, wherein the electrically polarizable material is in the phase which exhibits spontaneous polarization at the temperature $T_1$ and wherein the electrically polarizable material is in the phase which does not exhibit spontaneous polarization at the temperature $T_2$.

12. The apparatus of claim 1, wherein the electrically polarizable material is an electrically polarizable amorphous polymer material.

13. The apparatus of claim 1, wherein each of the one or more layers of electrically polarizable material comprises a ferroelectric material having a Curie temperature, $T_c$, such that when the temperature of the ferroelectric material is lower than the Curie temperature, $T_c$, the ferroelectric material is in a ferroelectric phase and when the temperature of the ferroelectric material is greater than the Curie temperature, $T_c$, the ferroelectric material is in a paraelectric or anti-ferroelectric phase.

14. The apparatus of claim 1, further comprising a DC voltage source, the control circuit applying a DC poling voltage from the DC voltage source to the one or more layers of electrically polarizable material during the initial cycle.

15. The apparatus of claim 1, further comprising a device for measuring the amount of residual charge remaining on the first and second electrodes, the control circuit disconnecting the first and second electrodes from the load when the residual charge reaches a predetermined level.

16. The apparatus of claim 1, wherein each of the one or more heat exchangers comprises a device for delivering a flow of one or more fluids to the one or more layers of electrically polarizable material or to a material in direct or indirect contact with the one or more layers of electrically polarizable material such that thermal energy is exchanged between the one or more fluids and the one or more layers of electrically polarizable material.

17. The apparatus of claim 16, further comprising a temperature measuring device for monitoring the temperature of the one or more fluids and/or a pressure measuring device for monitoring the pressure of the one or more fluids.

18. The apparatus of claim 1, wherein one or more fluid passages are formed in, on or adjacent to each of the first and second electrodes and wherein the one or more heat exchangers deliver one or more fluids into the fluid passages such that thermal energy is exchanged between the one or more fluids and the one or more layers of electrically polarizable material.

19. The apparatus of claim 16, further comprising a plurality of control valves for controlling the flow of the one or more fluids.

20. The apparatus of claim 19, further comprising one or more microcontrollers, wherein the plurality of control valves are controlled by one or more microcontrollers.

21. The apparatus of claim 1, further comprising:
 a temperature measuring device for monitoring the temperature of the one or more layers of electrically polarizable material;
 a capacitance measuring device for monitoring the capacitance of the one or more layers of electrically polarizable material;
 a polarization measuring device for monitoring the polarization of the one or more layers of electrically polarizable material; and/or
 a current measuring device for monitoring the current to and/or from the electrodes.

22. The apparatus of claim 1, comprising a plurality of layers of electrically polarizable material arranged in a stack between the first and second electrodes.

23. The apparatus of claim 22, wherein each of the layers of electrically polarizable material comprises the same electrically polarizable material.

24. The apparatus of claim 22, wherein the plurality of layers of electrically polarizable material comprises at least two different electrically polarizable materials.

25. The apparatus of claim 22, wherein at least two adjacent layers of electrically polarizable material in the stack are separated by an electrode formed of a thermally and electrically conductive material.

26. The apparatus of claim 22, wherein at least two adjacent layers of electrically polarizable material are separated by two electrodes each formed of a thermally and electrically conductive material and wherein the two electrodes are separated by an electrical insulator.

27. The apparatus of claim 1, wherein the control circuit comprises a switch having an open position and first and second closed positions, wherein the switch is connected between the first and second electrodes and wherein:
 when the switch is in the open position, current does not flow between the first and second electrodes;
 when the switch is in the first closed position, the DC voltage source is connected across the first and second electrodes; and
 when the switch is in the second closed position, the load is connected across the first and second electrodes.

28. The apparatus of claim 27, wherein the control circuit further comprises a first resistor and a second resistor, wherein:
 the first resistor is in series with the DC voltage source when the switch is in the first closed position; and
 wherein the first resistor and the second resistor are in series with the load when the switch is in the second closed position.

29. The apparatus of claim 27, wherein the control circuit further comprises an electrical storage device and wherein the electrical storage device is connected across the first and second electrodes when the switch is in the second closed position.

30. The apparatus of claim 7, (a) the control circuit in the initial cycle:
 (i) withdrawing thermal energy from the one or more layers of electrically polarizable material to cool the one or more layers of electrically polarizable material to the temperature $T_1$ using the one or more heat exchangers while current is not allowed to flow between the first and second electrodes during cooling;
 (ii) subsequently applying the DC poling voltage to the one or more layers of electrically polarizable material;
 (iii) withdrawing thermal energy from the one or more layers of electrically polarizable material using the one or more heat exchangers while the DC poling voltage is applied to the one or more layers of electrically polarizable material and current is allowed to flow between the first and second electrodes such that the electrically polarizable material develops an overall net spontaneous polarization and screening charges are generated on the first and second electrodes;
- (iv) removing the DC poling voltage from the one or more layers of electrically polarizable material;
- (v) subsequently adding thermal energy to the one or more layers of electrically polarizable material to heat the electrically polarizable material to the temperature $T_2$ using the one or more heat exchangers while not allowing current to flow between the electrodes, wherein the DC poling voltage is not applied to the one or more layers of electrically polarizable material while the electrically polarizable material is heated to temperature $T_2$;
- (vi) subsequently connecting the first and second electrodes across a load; and
- (vii) subsequently adding thermal energy to the one or more layers of electrically polarizable material while the electrodes are connected across the load such that electrical charges are discharged from the first and second electrodes, residual charges being left on the first and second electrodes to provide the poling voltage for the following cycles; and
- (b) the control circuit in subsequent cycles after the initial cycle:
  - (i) withdrawing thermal energy from the one or more layers of electrically polarizable material to cool the one or more layers of electrically polarizable material to the temperature $T_1$ using the one or more heat exchangers, while current is not allowed to flow between the first and second electrodes during cooling;
  - (ii) withdrawing thermal energy from the one or more layers of electrically polarizable material using the one or more heat exchangers while current is allowed to flow between the first and second electrodes such that the electrically polarizable material develops an overall net spontaneous polarization and screening charges are generated on the first and second electrodes;
  - (iii) subsequently adding thermal energy to the one or more layers of electrically polarizable material to heat the electrically polarizable material to the temperature $T_2$ using the one or more heat exchangers while not allowing current to flow between the electrodes;
  - (iv) subsequently connecting the first and second electrodes across a load; and
  - (v) subsequently adding thermal energy to the one or more layers of electrically polarizable material while the electrodes are connected across the load such that electrical charges are discharged from the first and second electrodes, residual charges being left on the first and second electrodes to provide the poling voltage for the following cycles.

31. The apparatus of claim 8, (a) the control circuit in the initial cycle:
- (i) adding thermal energy to the one or more layers of electrically polarizable material to heat the one or more layers of electrically polarizable material to the temperature $T_1$ using the one or more heat exchangers while current is not allowed to flow between the first and second electrodes during cooling;
- (ii) subsequently applying the DC poling voltage to the one or more layers of electrically polarizable material;
- (iii) adding thermal energy to the one or more layers of electrically polarizable material using the one or more heat exchangers while the DC poling voltage is applied to the one or more layers of electrically polarizable material and current is allowed to flow between the first and second electrodes such that the electrically polarizable material develops an overall net spontaneous polarization and screening charges are generated on the first and second electrodes;
- (iv) removing the DC poling voltage from the one or more layers of electrically polarizable material;
- (v) subsequently withdrawing thermal energy from the one or more layers of electrically polarizable material to cool the electrically polarizable material to the temperature $T_2$ using the one or more heat exchangers while not allowing current to flow between the electrodes, wherein the DC poling voltage is not applied to the one or more layers of electrically polarizable material while the electrically polarizable material is cooled to temperature $T_2$;
- (vi) subsequently connecting the first and second electrodes across a load; and
- (vii) subsequently withdrawing thermal energy from the one or more layers of electrically polarizable material while the electrodes are connected across the load such that electrical charges are discharged from the first and second electrodes, residual charges being left on the first and second electrodes to provide the poling voltage for the following cycles; and
- (b) the control circuit in subsequent cycles after the initial cycle:
  - (i) adding thermal energy to the one or more layers of electrically polarizable material to heat the one or more layers of electrically polarizable material to the temperature $T_1$ using the one or more heat exchangers while current is not allowed to flow between the first and second electrodes during cooling;
  - (ii) adding thermal energy from the one or more layers of electrically polarizable material using the one or more heat exchangers while current is allowed to flow between the first and second electrodes such that the electrically polarizable material develops an overall net spontaneous polarization and screening charges are generated on the first and second electrodes;
  - (iii) subsequently withdrawing thermal energy from the one or more layers of electrically polarizable material to cool the electrically polarizable material to the temperature $T_2$ using the one or more heat exchangers while not allowing current to flow between the electrodes;
  - (iv) subsequently connecting the first and second electrodes across a load; and
  - (v) subsequently withdrawing thermal energy from the one or more layers of electrically polarizable material while the electrodes are connected across the load such that electrical charges are discharged from the first and second electrodes, residual charges being left on the first and second electrodes to provide the poling voltage for the following cycles.

32. The apparatus of claim 1, the control circuit:
connecting the pair of electrodes to the load while adding thermal energy to the one or more layers of electrically polarizable material and/or withdrawing thermal energy from the one or more layers of electrically polarizable material.

33. A method for converting heat to electric energy, comprising:
thermally cycling an electrically polarizable material between a first temperature $T_1$ and a second temperature $T_2$ by alternately adding thermal energy to and withdrawing thermal energy from the electrically polarizable material, wherein the electrically polarizable material is positioned between first and second electrodes each formed of a thermally and electrically conductive material, wherein the electrically polarizable material exhibits spontaneous polarization at $T_1$ and wherein the spontaneous polarization exhibited by the electrically polarizable material at $T_2$ is less than the spontaneous polarization exhibited by the electrically polarizable material at $T_1$;

wherein a DC poling voltage is applied to the electrically polarizable material such that, when the electrically polarizable material is in a first portion of the cycle which includes the temperature $T_1$, the electrically polarizable material develops an overall net spontaneous polarization and screening charges are generated on the first and second electrodes; and wherein the first and second electrodes are connected to a load such that electrical energy is output from the first and second electrodes to the load when the electrically polarizable material is in a second portion of the cycle which includes the temperature $T_2$;

wherein residual charges are left on the first and second electrodes after electrical energy is output to the load and wherein the residual charges provide the DC poling voltage for the next cycle.

34. The method of claim 33, wherein the residual charges left on the first and second electrodes after electrical energy is output to the load are such that the resulting polarization exceeds the polarization at the local free energy maximum that occurs when thermally cycling the electrically polarizable material from $T_1$ to $T_2$.

35. The method of claim 33, further comprising rectifying the electrical energy output from the first and second electrodes to the load.

36. The method of claim 33, wherein $T_2$ is higher than $T_1$.

37. The method of claim 33, wherein $T_1$ is higher than $T_2$.

38. The method of claim 33, wherein the electrically polarizable material has a phase transition temperature at which the material transitions between a phase in which the material exhibits spontaneous polarization and a phase in which the material does not exhibit spontaneous polarization.

39. The method of claim 38, wherein the electrically polarizable material is in the phase which exhibits spontaneous polarization at the temperature $T_1$ and $T_2$.

40. The method of claim 38, wherein the electrically polarizable material is in the phase which exhibits spontaneous polarization at the temperature $T_1$ and wherein the electrically polarizable material is in the phase which does not exhibit spontaneous polarization at the temperature $T_2$.

41. The method of claim 33, wherein the electrically polarizable material is an electrically polarizable amorphous polymer material.

42. The method of claim 33, wherein each of the one or more layers of electrically polarizable material comprises a ferroelectric material having a Curie temperature, $T_c$, such that when the temperature of the ferroelectric material is lower than the Curie temperature, $T_c$, the ferroelectric material is in a ferroelectric phase and when the temperature of the ferroelectric material is greater than the Curie temperature, $T_c$, the ferroelectric material is in a paraelectric or anti-ferroelectric phase.

43. The method of claim 33, wherein adding thermal energy to and withdrawing thermal energy from the electrically polarizable material comprises delivering a flow of one or more fluids to the electrically polarizable material or to a material in direct or indirect contact with the electrically polarizable material such that thermal energy is exchanged between the one or more fluids and the electrically polarizable material.

44. The method of claim 43, wherein one or more fluid passages are formed in, on or adjacent to each of the first and second electrodes and wherein the one or more fluids is delivered into the fluid passages such that thermal energy is exchanged between the one or more fluids and the one or more layers of electrically polarizable material.

45. The method of claim 43, further comprising monitoring the temperature of the one or more fluids and/or the pressure of the one or more fluids.

46. The method of claim 33, further comprising monitoring one or more of:
  the temperature of the electrically polarizable material;
  the capacitance of the electrically polarizable material;
  the polarization of the electrically polarizable material; and/or
  the current flowing to and/or from the first and second electrodes.

47. The method of claim 36, wherein (a) in the initial cycle the method comprises:
  (i) withdrawing thermal energy from the electrically polarizable material to cool the electrically polarizable material to the temperature $T_1$ while current is not allowed to flow between the first and second electrodes;
  (ii) subsequently poling the electrically polarizable material by applying the DC poling voltage to the electrically polarizable material;
  (iii) withdrawing thermal energy from the electrically polarizable material while the DC poling voltage is applied to the electrically polarizable material and current is allowed to flow between the first and second electrodes such that the electrically polarizable material develops an overall net spontaneous polarization and screening charges are generated on the first and second electrodes;
  (iv) removing the DC poling voltage from the electrically polarizable material;
  (v) subsequently adding thermal energy to the electrically polarizable material to heat the electrically polarizable material to the temperature $T_2$ while not allowing current to flow between the first and second electrodes, wherein the DC poling voltage is not applied to the electrically polarizable material while the electrically polarizable material is heated to the temperature $T_2$;
  (vi) subsequently connecting the first and second electrodes across the load; and
  (vii) adding thermal energy to the electrically polarizable material while the first and second electrodes are connected across the load such that electrical charges are discharged from the first and second electrodes, residual charges being left on the first and second electrodes to provide the poling voltage for the following cycles; and
(b) in the following cycles the method comprises:
  (i) withdrawing thermal energy from the electrically polarizable material to cool the electrically polarizable material to the temperature $T_1$ while current is not allowed to flow between the first and second electrodes;
  (ii) withdrawing thermal energy from the electrically polarizable material while current is allowed to flow between the first and second electrodes such that the electrically polarizable material develops an overall net spontaneous polarization and screening charges are generated on the first and second electrodes;

(iii) subsequently adding thermal energy to the electrically polarizable material to heat the electrically polarizable material to the temperature $T_2$ while not allowing current to flow between the first and second electrodes;

(iv) subsequently connecting the first and second electrodes across the load; and (v) adding thermal energy to the electrically polarizable material while the first and second electrodes are connected across the load such that electrical charges are discharged from the first and second electrodes, residual charges being left on the first and second electrodes to provide the poling voltage for the following cycles.

48. The method of claim 47, wherein the first and second electrodes are connected across the load during (b)(ii).

49. The method of claim 48, further comprising rectifying the current passing between the first and second electrodes during (b)(ii) and (b)(v).

50. The method of claim 37, wherein (a) in the initial cycle the method comprises:
(i) adding thermal energy to the electrically polarizable material to heat the electrically polarizable material to the temperature $T_1$ while current is not allowed to flow between the first and second electrodes;
(ii) subsequently poling the electrically polarizable material by applying the DC poling voltage to the electrically polarizable material;
(iii) adding thermal energy to the electrically polarizable material while the DC poling voltage is applied to the electrically polarizable material and current is allowed to flow between the first and second electrodes such that the electrically polarizable material develops an overall net spontaneous polarization and screening charges are generated on the first and second electrodes;
(iv) removing the DC poling voltage from the electrically polarizable material;
(v) subsequently withdrawing thermal energy from the electrically polarizable material to cool the electrically polarizable material to the temperature $T_2$ while not allowing current to flow between the first and second electrodes, wherein the DC poling voltage is not applied to the electrically polarizable material while the electrically polarizable material is cooled to the temperature $T_2$;
(vi) subsequently connecting the first and second electrodes across a load; and
(vii) withdrawing thermal energy from the electrically polarizable material while the first and second electrodes are connected across the load such that electrical charges are discharged from the first and second electrodes, residual charges being left on the first and second electrodes to provide the poling voltage for the following cycles; and (b) in the following cycles the method comprises:
(i) adding thermal energy to the electrically polarizable material to heat the electrically polarizable material to the temperature $T_1$ while current is not allowed to flow between the first and second electrodes;
(ii) adding thermal energy to the electrically polarizable material while current is allowed to flow between the first and second electrodes such that the electrically polarizable material develops an overall net spontaneous polarization and screening charges are generated on the first and second electrodes;
(iii) subsequently withdrawing thermal energy to the electrically polarizable material to cool the electrically polarizable material to the temperature $T_2$ while not allowing current to flow between the first and second electrodes;
(iv) subsequently connecting the first and second electrodes across a load; and
(v) withdrawing thermal energy to the electrically polarizable material while the first and second electrodes are connected across the load such that electrical charges are discharged from the first and second electrodes, residual charges being left on the first and second electrodes to provide the poling voltage for the following cycles.

51. The method of claim 50, wherein the first and second electrodes are connected across the load during (b)(ii).

52. The method of claim 51, further comprising rectifying the current passing between the first and second electrodes during (b)(ii) and (b)(v).

53. The method of claim 33, wherein the method comprises:
adding thermal energy to the electrically polarizable material while the pair of electrodes is connected to the load and/or withdrawing thermal energy from the electrically polarizable material while the pair of electrodes is connected to the load.

54. The method of claim 38, wherein the method comprises:
(i) applying the poling voltage to the electrically polarizable material in or during the transition to the phase in which the electrically polarizable material exhibits spontaneous polarization; and
(ii) adding thermal energy to the electrically polarizable material while the pair of electrodes is connected to the load and/or withdrawing thermal energy from the electrically polarizable material while the pair of electrodes is connected to the load.

* * * * *